United States Patent
Baba et al.

(10) Patent No.: US 6,716,665 B2
(45) Date of Patent: Apr. 6, 2004

(54) METHOD OF MOUNTING CHIP ONTO PRINTED CIRCUIT BOARD IN SHORTENED WORKING TIME

(75) Inventors: Shunji Baba, Kawasaki (JP); Takatoyo Yamakami, Kawasaki (JP); Norio Kainuma, Kawasaki (JP); Kenji Kobae, Kawasaki (JP); Hidehiko Kira, Kawasaki (JP); Hiroshi Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 53 days.

(21) Appl. No.: 09/753,570

(22) Filed: Jan. 4, 2001

(65) Prior Publication Data

US 2001/0040298 A1 Nov. 15, 2001

(30) Foreign Application Priority Data

May 12, 2000 (JP) ......... 2000-139887
Nov. 1, 2000 (JP) ......... 2000-334550

(51) Int. Cl.[7] .................. H01L 21/44; H01L 21/48; H01L 21/50
(52) U.S. Cl. .............. 438/106; 438/113; 438/114; 438/127; 438/460
(58) Field of Search ............ 438/106, 108, 438/112, 118, 126, 127, 113, 114, 458, 460, 462

(56) References Cited

U.S. PATENT DOCUMENTS

| | | | | |
|---|---|---|---|---|
| 3,924,323 A | * | 12/1975 | Trevail et al. ........... 438/17 |
| 4,224,101 A | | 9/1980 | Tijburg et al. .......... 156/643 |
| 5,196,378 A | | 3/1993 | Bean et al. ............. 437/226 |
| 5,362,681 A | | 11/1994 | Roberts, Jr. et al. ...... 437/226 |
| 5,369,060 A | | 11/1994 | Baumann et al. ......... 437/226 |
| 5,426,072 A | | 6/1995 | Finnila ................ 437/208 |
| 5,457,072 A | | 10/1995 | Tamaki et al. ........... 437/226 |
| 5,547,906 A | | 8/1996 | Badehi ................ 437/227 |
| 5,552,345 A | | 9/1996 | Schrantz et al. ......... 437/227 |
| 5,593,917 A | * | 1/1997 | Nuyen ................. 438/28 |
| 5,597,766 A | | 1/1997 | Neppl ................. 437/226 |
| 5,904,546 A | | 5/1999 | Wood et al. ............ 438/460 |
| 5,904,548 A | * | 5/1999 | Orcutt ................ 438/462 |
| 5,918,113 A | * | 6/1999 | Higashi et al. ......... 438/119 |
| 5,972,780 A | * | 10/1999 | Machida et al. ......... 438/455 |
| 6,107,164 A | * | 8/2000 | Ohuchi ................ 438/465 |
| 6,271,102 B1 | * | 8/2001 | Brouillette et al. ...... 438/462 |
| 6,309,943 B1 | * | 10/2001 | Glenn et al. ........... 438/401 |
| 6,346,433 B1 | * | 2/2002 | Maeda et al. ........... 438/108 |
| 6,414,397 B1 | * | 7/2002 | Sawamoto ............. 257/783 |
| 6,425,971 B1 | * | 7/2002 | Silverbrook ............ 156/230 |
| 6,444,499 B1 | * | 9/2002 | Swiss et al. ........... 438/127 |

FOREIGN PATENT DOCUMENTS

| | | |
|---|---|---|
| JP | 58-97839 | 6/1983 |
| JP | 1-302733 | 12/1989 |
| JP | 7-142636 | 6/1995 |
| JP | 9-246326 | 9/1997 |
| JP | 10-242208 | 9/1998 |
| JP | 10-270497 | 10/1998 |
| JP | 2000-208660 | 7/2000 |

* cited by examiner

*Primary Examiner*—John F. Niebling
*Assistant Examiner*—Angel Roman
(74) *Attorney, Agent, or Firm*—Staas & Halsey LLP

(57) ABSTRACT

A wafer receiving conductive input/output bumps on the upward front side is placed on a platen. An underfill material sheet, adhered to the surface of the thin film tape, is superposed on the front side of the wafer. The underfill material sheet is forced to soften. When the underfill material sheet is urged against the wafer, the input/output bumps is allowed to penetrate through the underfill material sheet. After the underfill material is hardened, the thin film tape is peeled off from the hardened underfill material sheet. The underfill material can thus be supplied commonly to a large number of individual semiconductor chips included in the wafer. As compared with the case where the underfill material is supplied separately to the individual semiconductor chips, the working time can greatly be shortened.

17 Claims, 19 Drawing Sheets

METHOD OF MOUNTING CHIP ONTO PRINTED CIRCUIT BOARD IN SHORTENED WORKING TIME

BACKGROUND OF THE INVENTION

1. Field of the Invention

The present invention relates to a method of making a semiconductor chip out of a wafer as a bulk of semiconductor chips, and to a method of mounting a semiconductor chip onto a printed circuit board or substrate.

2. Description of the Prior Art

A semiconductor chip such as an integrated circuit (IC) is in general cut out of a silicon wafer. The cut out semiconductor chip is then mounted onto a printed circuit board. When the semiconductor chip is mounted in this manner, input/output bumps on the semiconductor chip is received on the surface of a substrate of the printed circuit board. The input/output bumps serve to establish an electric connection between the semiconductor chip and the printed circuit board.

An underfill material is filled in a space between the semiconductor chip and the substrate of the printed circuit board. The underfill material serves not only to prevent any deterioration such as corrosion of the input/output bumps but also to reinforce the bonding between the semiconductor chip and the substrate of the printed circuit board.

In general, a dispenser is employed to supply the underfill material. The dispenser is designed to discharge the liquid of the underfill material for the individual semiconductor chips one after another. It takes a longer time to supply the underfill material to all of the semiconductor chips.

In addition, the input/output bumps are in general formed on the upward surface of the silicon wafer. The individual semiconductor chip cut out of the silicon wafer should be reversed before the semiconductor chip is actually mounted on the substrate of the printed circuit board. It also takes a longer time to reverse each of the semiconductor chips cut out of the wafer.

SUMMARY OF THE INVENTION

It is accordingly an object of the present invention to provide a method of mounting a semiconductor chip onto a printed circuit board in a shortened working time.

According to the present invention, there is provided a method of supplying an underfill material for a semiconductor chip, comprising: locating a wafer which receives a conductive bump on an upward front side; and transferring an underfill material sheet adhered to a surface of a thin film member onto the upward front side of the wafer.

The underfill material can be supplied commonly to a plurality of semiconductor chips included in the wafer in the method of supplying. Accordingly, the working time can greatly be reduced as compared with the case where the underfill material is supplied separately to the individual semiconductor chips. In particular, if the supply of the underfill material can be completed before the semiconductor chip is mounted on a printed circuit board or substrate in this manner, the method of mounting the semiconductor chip onto a printed circuit board or substrate is supposed to be facilitated.

The method of supplying may further comprise: urging the underfill material sheet onto the upward front side of the wafer after softening the underfill material sheet when transferring the underfill material sheet onto the wafer; and peeling the thin film member from the underfill material sheet after hardening the underfill material sheet. The transfer of the underfill sheet in this manner may be achieved prior to or after cut-out of the individual semiconductor chips.

According to a second aspect of the present invention, there is provided a method of mounting a semiconductor chip onto a printed circuit board or substrate, comprising reversing a wafer as a bulk of semiconductor chips prior to pickup of an individual semiconductor chip.

The method of mounting allows the semiconductor chips to be reversed in the block. Accordingly, the working time can greatly be reduced as compared with the case where the individual semiconductor chips are separately reversed.

According to a third aspect of the present invention, there is provided a method of mounting a semiconductor chip onto a printed circuit board or substrate, comprising: forming a conductive bump on an upward front side of a wafer; dicing the wafer on a first support member so as to cut out individual semiconductor chips; superposing a second support member over the first support member so as to hold the semiconductor chips between the first and second support members; reversing the first support member along with the second support member holding the semiconductor chips therebetween; picking up the individual semiconductor chips after removing the first support member.

The method of mounting allows the semiconductor chips, held between the first and second support members, to be reversed in the block. Accordingly, the working time can greatly be reduced as compared with the case where the individual semiconductor chips are separately reversed.

According to a fourth aspect of the present invention, there is provided a method of making a semiconductor chip, comprising: forming a conductive bump on an upward front side of a wafer; reversing the wafer; and forming a resin lamination on a backside of the wafer.

The resin lamination can be formed on the backsides of the individual semiconductor chips cut out of the wafer in the method of making. The resin lamination is allowed to hold tiny fragments, fractured out of the semiconductor chip, on the semiconductor chip. The resin lamination thus prevents a scatter or drop of the tiny fragments. The resin lamination serves to reliably suppress generation of dust resulting from the semiconductor chip to the utmost.

In providing the resin lamination, the method of making may further comprise transferring a resin sheet, adhered to a surface of a thin film member, to the backside of the wafer. This process enables a common supply of the resin lamination to a plurality of semiconductor chips included in the wafer. Accordingly, the working time can greatly be reduced as compared with the case where formation of the resin lamination is conducted separately for the individual semiconductor chips. In particular, if the supply of the resin lamination can be completed before the semiconductor chip is mounted on a printed circuit board or substrate in this manner, the method of mounting the semiconductor chip onto a printed circuit board or substrate is supposed to be facilitated.

According to a fifth aspect of the present invention, there is provided a method of making a semiconductor chip, comprising: reversing a wafer receiving a conductive bump on an upward front side; and dicing the wafer from a backside of the wafer.

When the dicing process is effected on the wafer, the individual semiconductor chips can be cut out of the wafer. The cut out semiconductor chip is then picked up, so that it can be mounted on a printed circuit board or substrate. It is not necessary to reverse the individual semiconductor chips after the dicing process in mounting the semiconductor chip onto a printed circuit board or substrate. Accordingly, the subsequent method of mounting can thus greatly be facilitated. The working time can further be shortened.

The wafer may be subjected to irradiation of an electromagnetic wave. Any metallic lamination and/or conductive bumps are in general supposed to block the transmission of the electromagnetic wave. The electromagnetic wave passing or penetrating through the wafer is allowed to reveal the position and shape of the metallic lamination and/or conductive bumps. The thus revealed positions for the metallic lamination and/or conductive bumps in this manner enable a precise and reliable determination of the cutting position in a facilitated manner without directly observing the metallic lamination and/or conductive bumps.

The method of making may further comprise: forming a nick along a contour of the semiconductor chip on the backside of the wafer. If an evaporated resin lamination is formed within the nick, a broader coverage of the evaporated resin lamination can be obtained over the surface of the resulting semiconductor chip as compared with the case where the individual semiconductor chips are simply cut out of the wafer without formation of the nick. The evaporated resin lamination is allowed to hold tiny fragments, fractured out of the semiconductor chip, on the semiconductor chip. The evaporated resin lamination thus prevents a scatter or drop of the tiny fragments. The evaporated resin lamination serves to reliably suppress generation of dust resulting from the semiconductor chip to the utmost.

When the evaporated resin lamination is allowed to remain in the nick, the method of making may further comprise cutting out an individual semiconductor chip along the nick with an incision narrower than the nick after formation of the evaporated resin lamination. The narrower incision along the nick thus serves to form a flange on the semiconductor chip adjacent the nick. The evaporated resin lamination is allowed to reliably remain in the nick except the area subjected to the incision. Accordingly, the evaporated resin lamination is allowed to reliably remain on the flange and the side of the cut out semiconductor chip. In particular, if the incision is forced to trace the centerline of the nick, the single incision leads to formation of the flanges on the adjacent semiconductor chips separated by the incision.

According to a sixth aspect of the present invention, there is provided a method of making a semiconductor chip, comprising: locating a wafer receiving a conductive bump on an upward front side; adhering an underfill material sheet onto the upward front side of the wafer; reversing the wafer; and dicing the wafer from a backside of the wafer.

The underfill material can be supplied commonly to a plurality of semiconductor chips included in the wafer in the method of making. The working time can greatly be reduced as compared with the case where the underfill material is supplied separately to the individual semiconductor chips. In addition, the method of making allows the semiconductor chips to be reversed in the block prior to the dicing process. Accordingly, the working time can further be reduced as compared with the case where the individual semiconductor chips are separately reversed. Moreover, the method of making enables elimination of reversal of the individual semiconductor chips after the dicing process, so that the subsequent method of mounting can thus greatly be facilitated. The working time can still further be shortened.

The wafer may be subjected to irradiation of an electromagnetic wave in the aforementioned manner. Also, the backside of the wafer may be subjected to formation of a nick along a contour of the semiconductor chip in the aforementioned manner. An evaporated resin lamination may likewise be formed on the backside of the wafer. Additionally, the individual semiconductor chips may be cut out of the wafer along the nick with an incision narrower than the nick after formation of the evaporated resin lamination.

According to a seventh aspect of the present invention, there is provided a semiconductor chip comprising: a conductive bump; a chip body receiving the conductive bump at a downward front side; a flange extending outward from a periphery of the chip body; and an evaporated resin lamination extending along an upward surface of the flange, the periphery of the chip body and an upward backside of the chip body.

In general, when the semiconductor chip is mounted on a printed circuit board or substrate, an underfill material is filled up within a space between the semiconductor chip and the surface of the printed circuit board or substrate. If the semiconductor chip is urged against the printed circuit board or substrate, the conductive bump is squeezed or compressed. As the conductive bump thus gets flattened or low-profiled, the underfill material is allowed to overflow out of the space defined between the semiconductor chip and the surface of the printed circuit board or substrate. The overflowing underfill material flows along the flange so as to finally reach the side or periphery of the chip body. The chip body is thus completely contained within the evaporated resin lamination and the underfill material. A complete containment of the chip body in this manner serves to hold tiny fragments, fractured out of the chip body, on the chip body. A scatter of drop of the tiny fragments can completely be prevented.

In making the semiconductor chip of the above type, a method of mounting a semiconductor chip onto a printed circuit board, may comprise: locating a wafer receiving an underfill material sheet on a downward front side receiving a conductive bump; forming a nick along a contour of the semiconductor chip on an upward backside of the wafer; forming an evaporated resin lamination on the upward backside of the wafer; and cutting out an individual semiconductor chip along the nick with an incision narrower than the nick.

An underfill material supplying film or tape may be employed to supply the underfill material sheet onto the wafer. The underfill material supplying film may comprise: a thin film tape; and an underfill material sheet superposed on a surface of the thin film tape. The contour of the underfill material sheet is allowed to reflect the shape of the wafer.

In particular, a through hole is preferably defined to continuously penetrate through the thin film tape and the underfill material sheet in the underfill material supplying tape. The through hole serves to release a gas such as an air existing in the vicinity of the conductive bump when the underfill material supplying tape is superposed on the front side of the wafer. A gas is prevented from staying between the front side of the wafer and the underfill material sheet. The underfill material sheet is allowed to reliably contact the front side of the wafer over its entire surface.

It is preferable that the location or arrangement of the through hole reflects the location or arrangement of a conductive bump received on a surface of a corresponding wafer. If the height of the conductive bump is set larger than the thickness of the underfill material sheet, the conductive bump is allowed to reliably project the tip end out of the underfill material sheet through the through hole. Exposure of the tip end of the conductive bump enables a reliable establishment of the connection between the conductive bump on the semiconductor chip and a corresponding conductive pad on a printed circuit board or substrate.

An anisotropic conductive material sheet may be employed as an underfill material sheet in the underfill material supplying film. The anisotropic conductive material sheet may include metallic particles dispersed in an insulating layer received on the surface of the thin film tape. Employment of the underfill material supplying tape of this type allows the metallic particles to be interposed between a conductive bump on a semiconductor chip and a corresponding conductive pad on a printed circuit board or substrate when the semiconductor chip is to be mounted on the printed circuit board or substrate. An electric connection can reliably be established between the conductive bump and the corresponding conductive pad. In particular, even in the case where a large number of conductive bumps are formed on the single semiconductor chip, an electric connection can reliably be established between the conductive bumps and the corresponding conductive pads, respectively.

An utter insulating layer without metallic particles may be formed to extend over the surface of the insulating layer. The utter insulating layer serves to apparently increase the thickness of the underfill material sheet including the anisotropic conductive material sheet without losing the function of the anisotropic conductive material sheet. The usage of the expensive anisotropic conductive material sheet can be reduced as compared with the case where the anisotropic conductive material sheet is solely included in the underfill material supplying film. Superposition of the utter insulating layer contributes to reduction in the production cost.

According to an eighth aspect of the present invention, there is provided a semiconductor chip mounter comprising: a platen; a bonding head opposing a chip receiving surface to the platen; and an electromagnetic wave output opening defined at the chip receiving surface of the bonding head. Here, an optical fiber guiding an infrared ray from an infrared source may expose its tip end at the electromagnetic wave output opening.

The semiconductor chip mounter may be employed to realize a method of mounting a semiconductor chip onto a printed circuit board, comprising: attaching the semiconductor chip, receiving a conductive bump embedded in an underfill material sheet, to a chip receiving surface of a bonding head; detecting the shadow of the conductive bump based on an electromagnetic wave penetrating through the semiconductor chip; and positioning the bonding head based on the shadow of the conductive bump. The method of mounting serves to reliably position the semiconductor chip relative to the printed circuit board even when the conductive bump is completely embedded within the underfill material sheet.

According to a ninth aspect of the present invention, there is provided a semiconductor chip mounter comprising: a platen; a bonding head opposing a chip receiving surface to the platen; and an irradiation source opposed to the chip receiving surface of the bonding head so as to irradiate an electromagnetic wave toward the chip receiving surface.

The semiconductor chip mounter may be employed to realize a method of mounting a semiconductor chip onto a printed circuit board, comprising: attaching the semiconductor chip, receiving a conductive bump embedded in an underfill material sheet, to a chip receiving surface of a bonding head; irradiating an electromagnetic wave toward the underfill material sheet; photographing a fluorescent light of the underfill material sheet; and positioning the bonding head based on the intensity of the fluorescent light. The method of mounting serves to reliably position the semiconductor chip relative to the printed circuit board even when the conductive bump is completely embedded within the underfill material sheet.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
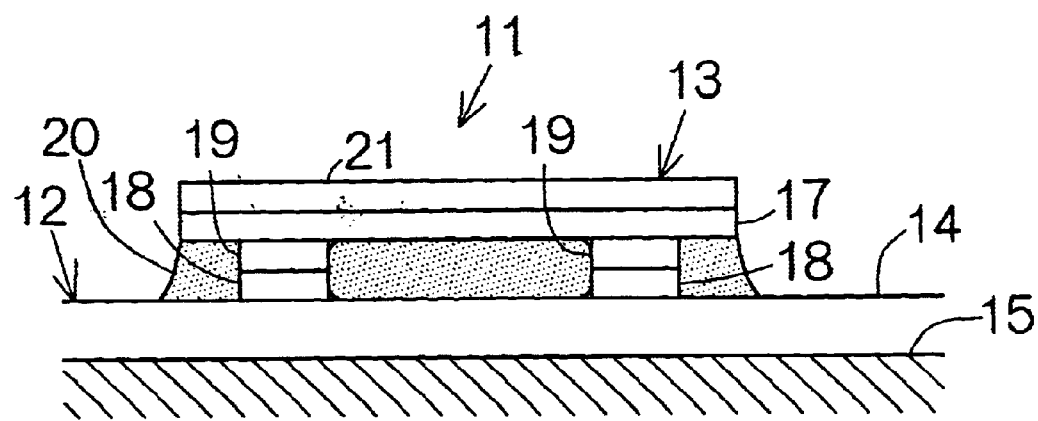
FIG. 1 is a side view schematically illustrating the structure of a printed circuit board unit according to a first embodiment of the present invention.

FIG. 1 schematically illustrates the structure of a printed circuit board unit 11 according to a first embodiment of the present invention. The printed circuit board unit 11 includes a printed circuit board 12 and a semiconductor chip 13 mounted on the printed circuit board 12. The printed circuit board 12 is designed to comprise a substrate 15 such as a stainless steel thin plate, for example. An insulating layer 14 is laminated on the surface of the substrate 15. The insulating layer 14 may be made of a synthetic resin such as polyimide, for example. A conductive wiring pattern is formed to extend over the surface of the insulating layer 14 on the printed circuit board 12. Alternatively, the insulating layer 14 may solely establish a so-called flexible printed circuit board (FPC) without support of any rigid substrate. Otherwise, a thin plate of a ceramic material may be employed to directly receive the conductive wiring pattern.

The semiconductor chip 13 includes a chip body 17 and one or more conductive input/output bumps 19 mounted on the lower or downward front side of the chip body 17. A semiconductor circuit is established within the chip body 17. The input/output bumps 19 are received on corresponding conductive input/output pads 18 as a part of the conductive wiring pattern on the printed circuit board 12. The input/output bumps 19 are bonded to the corresponding input/output pads 18. An electric connection is thus established between the chip body 17 and the conductive wiring pattern.

An underfill layer 20 is interposed between the chip body 17 of the semiconductor chip 13 and the surface of the printed circuit board 12. The input/output bumps 19 are completely embedded within the underfill layer 20 between the chip body 17 and the printed circuit board 12. The underfill layer 20 serves not only to prevent deterioration such as corrosion of the input/output bumps 19 but also to reinforce the bonding between the semiconductor chip 13 and the printed circuit board 12.

A resin lamination 21 is formed to spread over the upward backside of the chip body 17. The resin lamination 21 is designed to completely cover over the backside of the chip body 17. A thermosetting resin material may be employed to form the resin lamination 21. Alternatively, a light reactive resin material such as an ultraviolet reactive resin material, or a reactive resin such as an ultraviolet reactive thermosetting resin material which gets hardened in response to a combination of heat and irradiation of an ultraviolet, may be employed to take the place of the thermosetting resin material.

The resin lamination 21 serves to hold tiny fragments, fractured out of the chip body 17, on the chip body 17. The resin lamination 21 thus prevents a scatter or drop of the tiny fragments. This type of the semiconductor chip 13 can be incorporated within a clean space defined in an enclosure of a hard disk drive (HDD), for example. Generation of dust should be prevented in the enclosure of the HDD since the dust is supposed to induce a scatter or damage on a hard or magnetic disk in the HDD.

Figure 2:
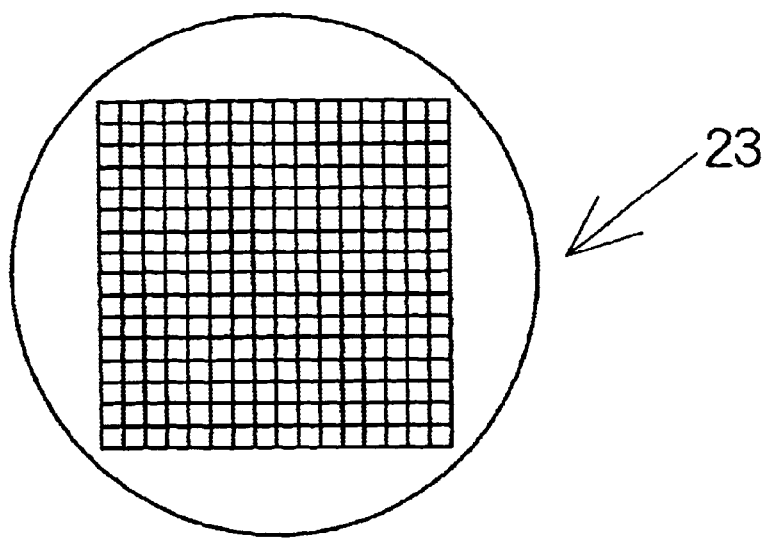
FIG. 2 is a plan view of a silicon wafer.

Next, a detailed description will be made on a method of making the semiconductor chip 13. A disk-shaped silicon wafer 23 is first prepared as shown in FIG. 2. 6,000 or 7,000 semiconductor circuits may be formed on the single silicon wafer 23, for example, as a bulk of semiconductor chips 13. The individual semiconductor chip 13 is finally cut out of the silicon wafer 23.

Figure 3:
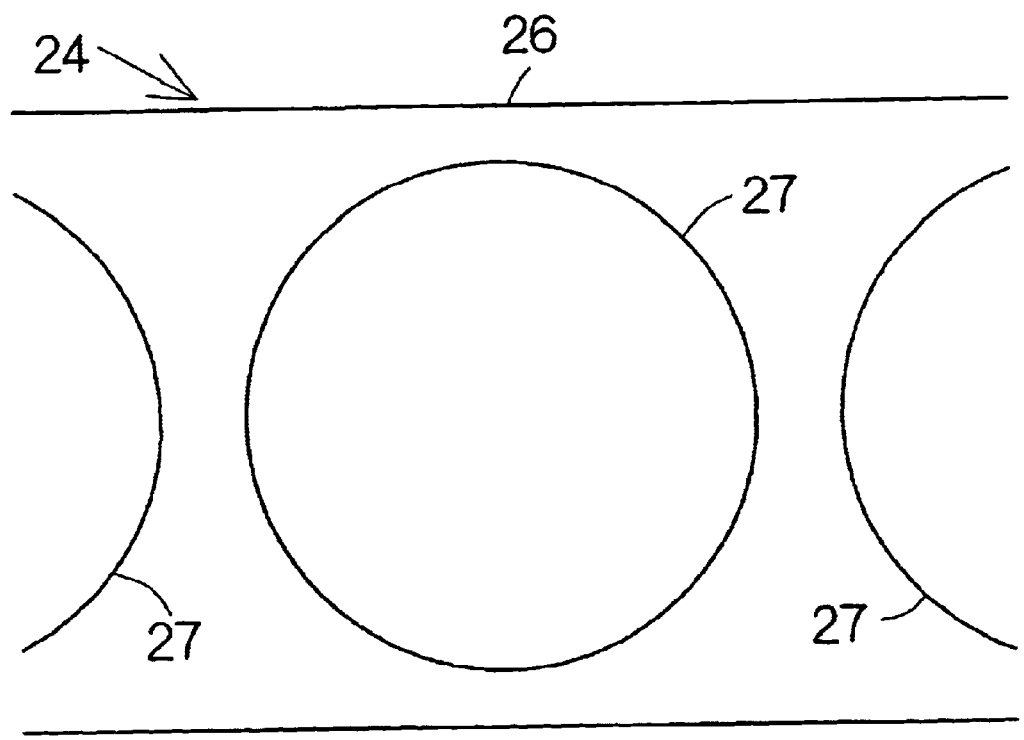
FIG. 3 is a partial plan view of a first material supplying tape.
Figure 4:
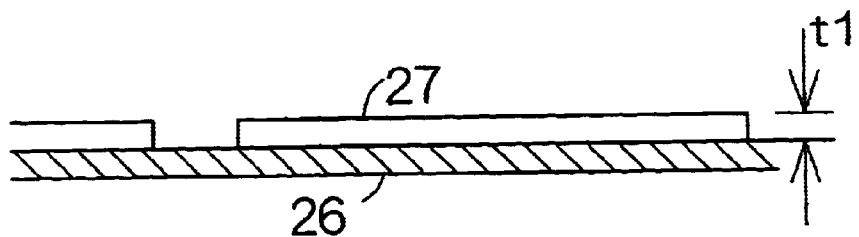
FIG. 4 is a partial sectional view of the first material supplying tape.

In addition, first and second material supplying tapes 24, 25 are also prepared. As is apparent from FIG. 3, the first material supplying tape 24 includes resin material sheets or layers 27 adhered to the surface of a thin film tape or member 26, for example. The resin material sheet 27 may be shaped in a manner corresponding to the contour of the silicon wafer 23. The resin material sheets 27 are arranged in line at constant intervals along the longitudinal direction of the thin film member 26. As shown in FIG. 4, the thickness of the resin material sheet 27 is set at t1[$\mu$m], for example.

The thin film member 26 may be made from polyvinyl chloride (PVC), polyethylene terephthalate (PET), and the like. Here, the thin film member 26 is designed to accept penetration of the ultraviolet ray. On the other hand, an ultraviolet reactive adhesive may be employed to form the resin material sheets 27, for example. A silane coupling agent is mixed in the ultraviolet reactive adhesive. The mixture of the coupling agent serves to allow the ultraviolet reactive adhesive to establish a higher adhesion to the silicon as compared with the adhesion to the PVC and PET.

Figure 5:
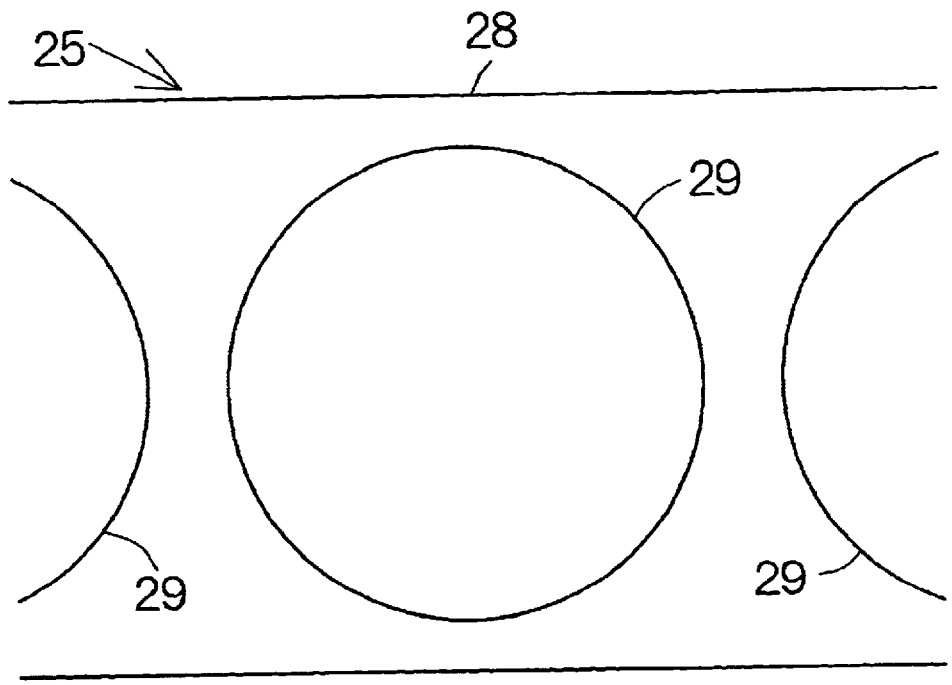
FIG. 5 is a partial plan view of a second material supplying tape.
Figure 6:
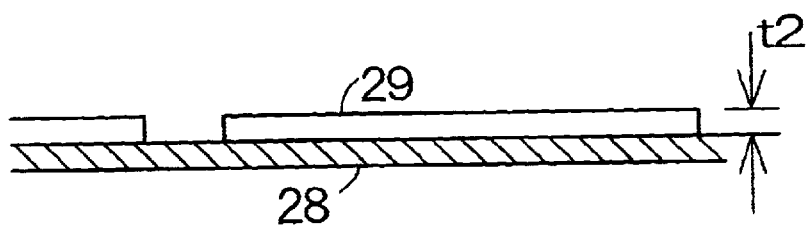
FIG. 6 is a partial sectional view of the second material supplying tape.

As is apparent from FIG. 5, the second material supplying tape 25 includes circular underfill material sheets or layers 29 adhered to the surface of a thin film member or tape 28 made from PVC or PET, for example. The underfill material sheet 29 may be shaped to have the diameter slightly smaller than that of the silicon wafer 23. The underfill material sheets 29 are arranged in line at constant intervals along the longitudinal direction of the thin film member 28. As shown in FIG. 6, the thickness of the underfill material sheet 29 is set at t2[$\mu$m], for example.

Here, the underfill material sheet 29 is designed to have a predetermined adhesion at a room temperature, for example. The underfill material sheet 29 is allowed to soften at the temperature below a threshold around 70 degrees Celsius and to harden at the temperature beyond a threshold around 150 degrees Celsius, for example. The mixture of a thermosetting adhesive and a thermoplastic resin may be employed to establish the underfill material sheet 29 of this property, for example. The thermosetting adhesive may be obtained by compounding a hardening such as imidazole with an epoxy resin of the bisphenol system. The thermosetting adhesive including a polyamideimide material at 50 weight % will provide the underfill material sheet 29 of the aforementioned property.

Figure 7:
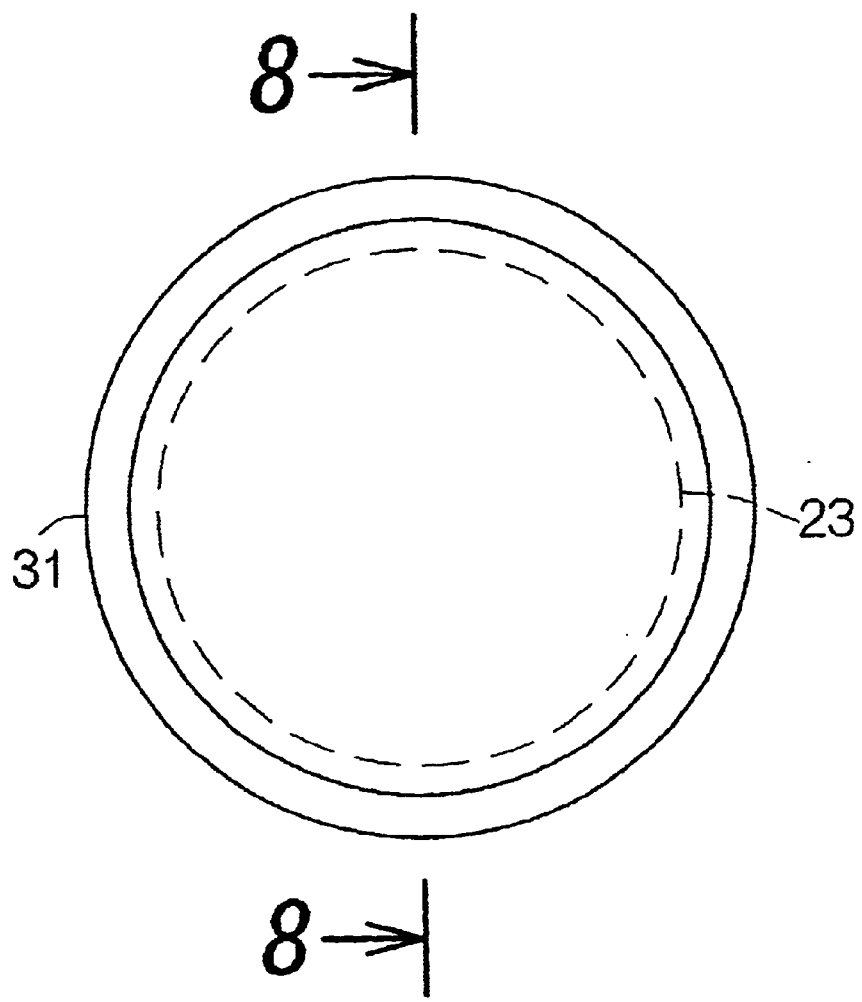
FIG. 7 is a plan view of an annular member.
Figure 8:
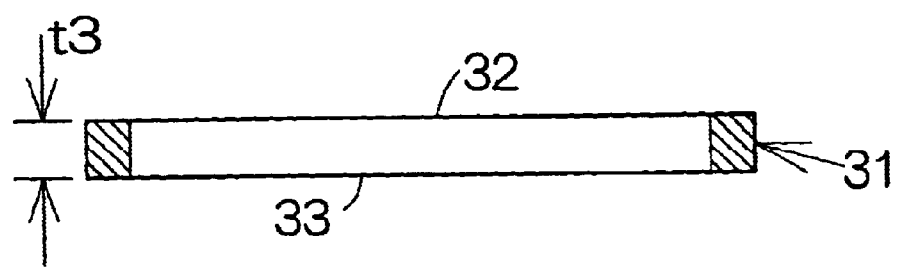
FIG. 8 is a sectional view taken along the line 8—8 in FIG. 7.

Furthermore, a stainless steel annular member 31 is also prepared as shown in FIG. 7, for example. The bore or caliber of the annular member 31 is set slightly larger than the outer periphery of the silicon wafer 23. Moreover, first and second datum planes 32, 33 are respectively defined on the annular member 31 in parallel with each other, as shown in FIG. 8. The distance between the datum planes 32, 33, namely, the thickness t3[$\mu$m] of the annular member 31 is designed to correspond to the sum of the thickness t1, t2 of the resin and underfill material sheets 27, 29 and the thickness of the silicon wafer 23.

Figure 9:
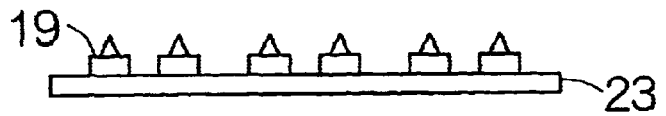
FIG. 9 illustrates the process of forming input/output bumps on the front side of the silicon wafer.

As shown in FIG. 9, golden input/output bumps 19 are first formed on the front side of the silicon wafer 23. The input/output bumps 19 may be formed by a method of wire bonding or electrodeposition, as conventionally known. In the case where the input/output bumps 19 are formed by wire bonding, for example, a pointed apex is defined at the tip end of the individual input/output bump 19, as is apparent from FIG. 9. The height of the input/output bump 19 including the pointed apex is set equal to the thickness t2 of the aforementioned underfill material sheet 29. Any conductive material, such as a solder, can be employed to form the input/output bumps 19, in place of the aforementioned gold.

Figure 10:
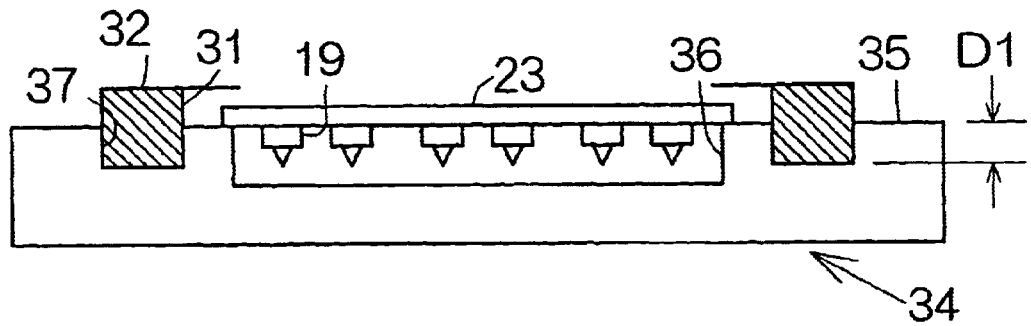
FIG. 10 illustrates the silicon wafer placed on a first platen after reversal.

As shown in FIG. 10, the silicon wafer 23 is then placed on a horizontal plane 35 on a first platen 34 after being reversed to a downward front side position. When the silicon wafer 23 has been reversed, the input/output bumps 19 protrude downward from the surface of the silicon wafer 23. A cylindrical hole or hollow 36 is defined in the first platen 34 so as to allow the downward input/output bumps 19 to enter the hollow 36 when the silicon wafer 23 is placed on the horizontal plane 35 of the first platen 34. The outer periphery of the silicon wafer 23 is received on the horizontal plane 35 around the hollow 36.

Here, an annular groove 37 (FIG. 10) is defined on the horizontal plane 35 of the first platen 34 so as to surround the hollow 36. The depth D1 of the annular groove 37 is set equal to the thickness t2 of the underfill material sheet 29 (see FIG. 6). The annular member 31 is detachably fitted into the annular groove 37. The height measured from the horizontal plane 35 to the first datum plane 32 of the annular member 31 is set equal to the total thickness of the silicon wafer 23 and the resin material sheet 27.

Figure 11:
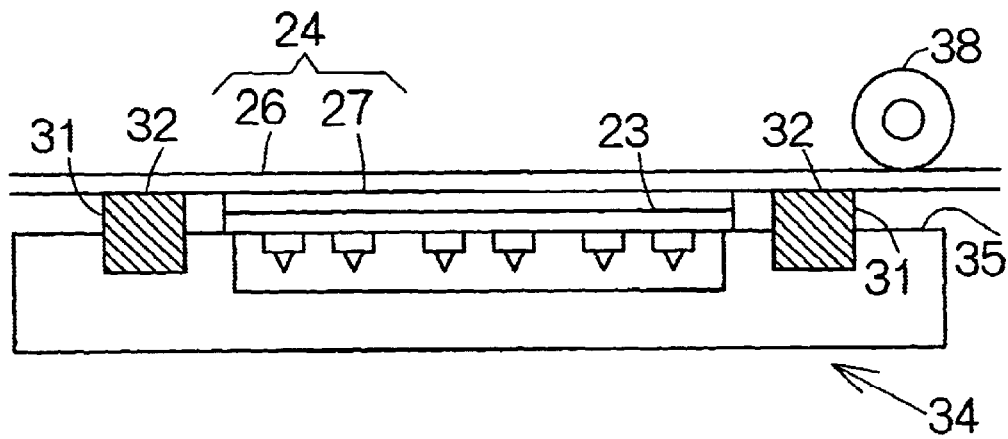
FIG. 11 illustrates the process of urging and adhering the first material supplying tape on the backside of the silicon wafer.

Subsequently, the first material supplying tape 24 is superposed on the first datum plane 32 of the annular member 31, as shown in FIG. 11. A pressurizing roller 38 is employed to urge the first material supplying tape 24 toward the horizontal plane 35. The thin film member 26 of the first material supplying tape 24 is thus temporarily adhered to the first datum plane 32 of the annular member 31. The resin material sheet 27 adhered to the surface of the thin film member 26 is urged against the backside of the silicon wafer 23.

Figure 12:
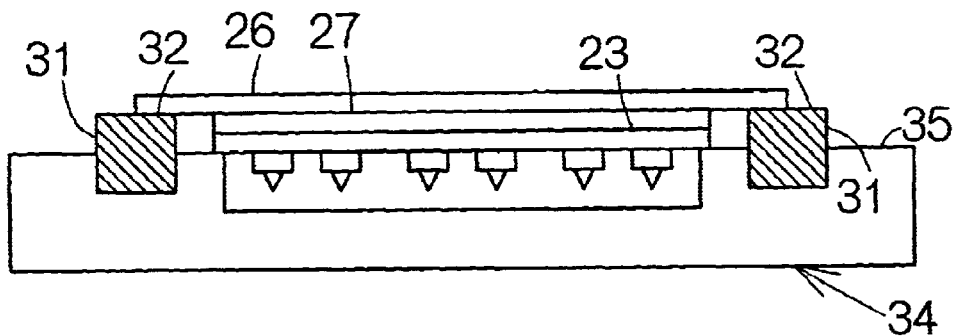
FIG. 12 illustrates the silicon wafer after the thin film member is cut out of the first material supplying tape.

Thereafter, the first material supplying tape 24 is subjected to cutting along the annular member 31, as shown in FIG. 12. The thin film member 26 cut out of the first material supplying tape 24 serves to keep connection between the annular member 31 and the silicon wafer 23. The adhesion of the resin material sheet 27 keeps the contact between the thin film member 26 and the resin material sheet 27 as well as between the resin material sheet 27 and the silicon wafer 23.

Figure 13:
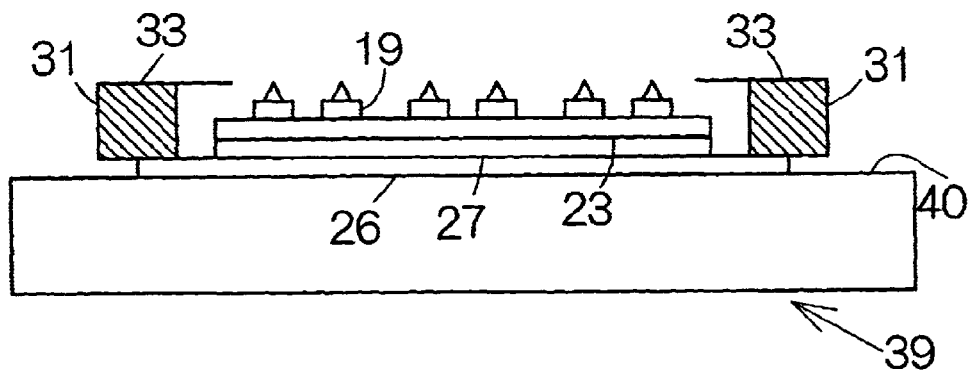
FIG. 13 illustrates the silicon wafer placed on a second platen after another reversal.
Figure 14:
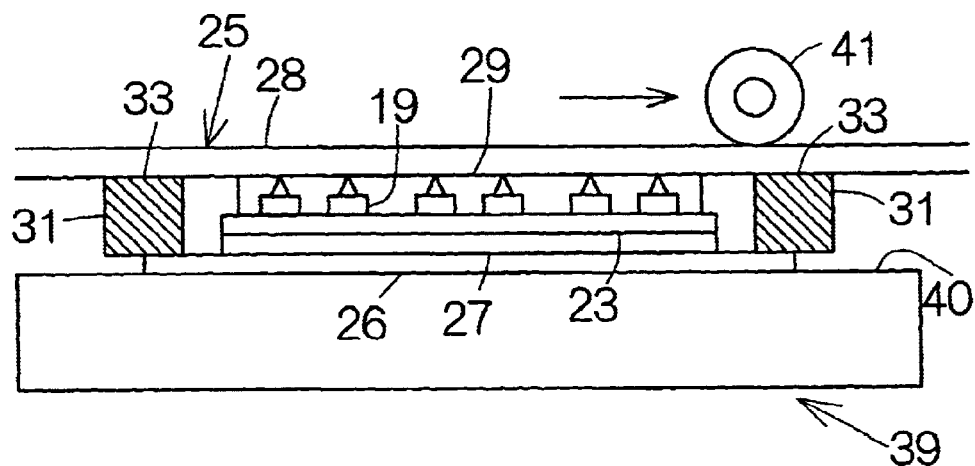
FIG. 14 illustrates the process of urging and adhering the second material supplying tape on the front side of the silicon wafer.

As shown in FIG. 13, the silicon wafer 23 is then reversed again and placed on a horizontal plane 40 on a second platen 39. The reversal of the silicon wafer 23 can be achieved by grasping or holding the silicon wafer 23. Alternatively, the annular member 31 may be grasped or held in reversing the silicon wafer 23. The silicon wafer 23 is received on the horizontal plane 40 at the backside. As shown in FIG. 14, the second material supplying tape 25 is superposed on the second datum plane 33 of the annular member 31 on the second platen 39. The in an upward front side position. The second material supplying tape 25 is then subjected to a heating treatment at the temperature around 70 degrees Celsius. The applied heat enables softening of the underfill material sheets 29 in the second material supplying tape 25.

Figure 15:
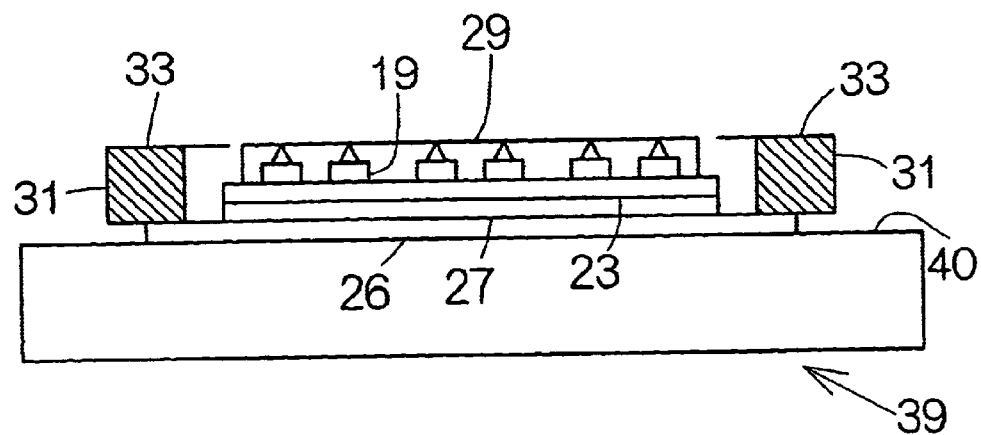
FIG. 15 illustrates the silicon wafer when the thin film member has been peeled off.

When the second material supplying tape 25 is thereafter urged against the horizontal plane 40 of the second platen 39 with the assistance of a pressurizing roller 41, for example, the input/output bumps 19 bite into the softened underfill material sheet 29. The input/output bumps 19 are allowed to project the tip ends out of the underfill material sheet 29. The tip ends of the input/output bumps 19 reach the thin film member 28. Subsequently, when the underfill material sheet 29 is cooled down to the room temperature, the underfill material sheet 29 gets hardened. After the underfill material sheet 29 has hardened, the thin film member 28 of the second material supplying tape 25 is peeled off, as shown in FIG. 15. The underfill material sheet 29 temporarily adhered to the surface of the thin film member 28 is in this manner transferred to the surface of the silicon wafer 23. Prior to cooling and peeling, the thin film member 28 may be cut out of the second material supplying tape 25 along the annular member 31 in some cases.

Figure 16:
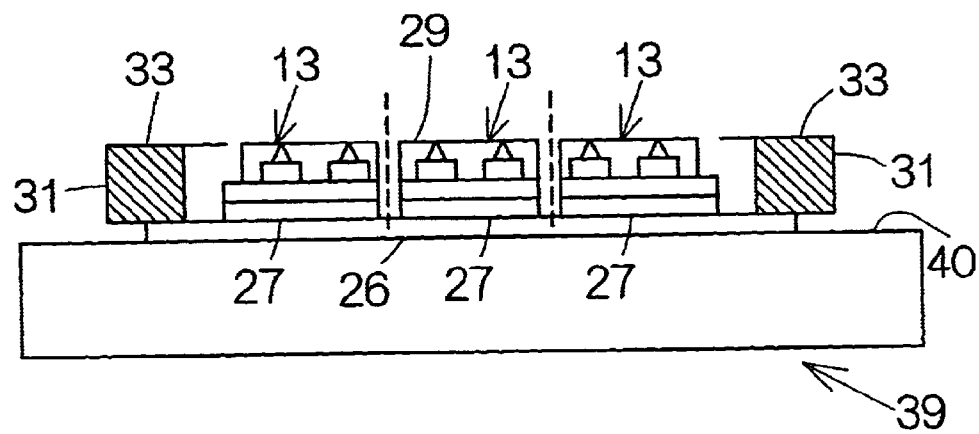
FIG. 16 illustrates the process of dicing the silicon wafer so as to provide the individual semiconductor chips.

When the transfer of the underfill material sheet 29 has been completed, the silicon wafer 23 is subjected to a dicing process, as shown in FIG. 16. Individual semiconductor chips 13 are cut out of the silicon wafer 23. The production of the semiconductor chips 13 has been completed. When the ultraviolet ray is irradiated on the separated resin material sheets 27, the resin material sheets 27 are forced to harden at the backside of the silicon wafer 23, namely, at the backsides of the respective semiconductor chips 13. The silane coupling agent in the resin material sheet 27 serves to keep the contact between the resin material sheet 27 and the silicon wafer 23 or chip body 17. On the other hand, the silane coupling agent serves to reduce the adhesion between the resin material sheet 27 and the thin film member 26. The individual semiconductor chip 13 can thus be picked up from the thin film member 26. The picked up semiconductor chip 13 may then be mounted on the printed circuit board 12 in some cases.

Figure 17:
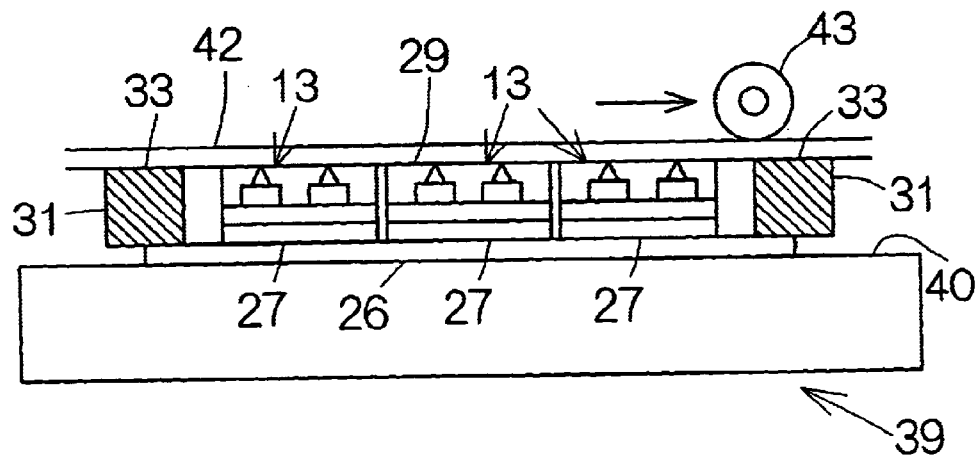
FIG. 17 illustrates the semiconductor chips held between the film tape and the thin film member of the second material supplying tape.

In this embodiment, a film tape 42 is superposed on the second datum plane 33 of the annular member 31, as shown in FIG. 17, after the individual semiconductor chips 13 have been cut off. A predetermined adhesion is previously applied to the surface of the film tape 42. When the film tape 42 is urged against the horizontal plane 40 of the second platen 39 with the assistance of a pressurizing roller 43, for example, the film tape 42 is adhered to the annular member 31 and the underfill material sheets 29. All of the semiconductor chips 13 are in this manner held between the film tape 42 and the thin film member 26. The film tape 42 is then cut along the annular member 31.

Figure 18:
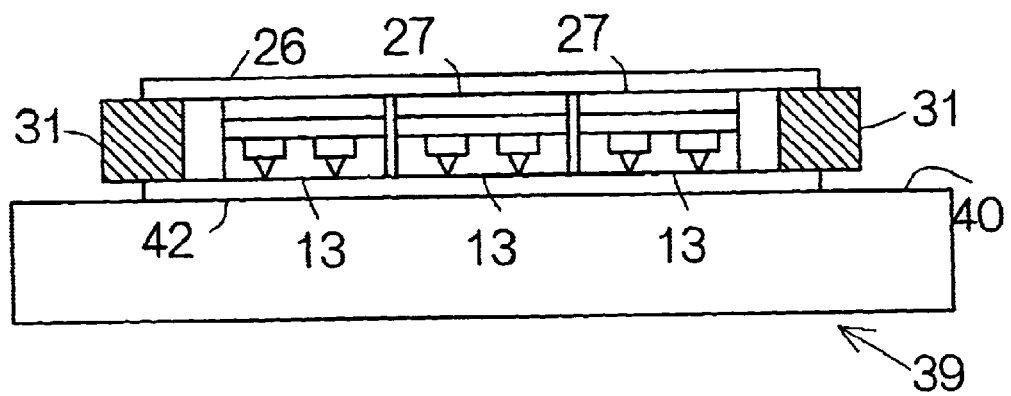
FIG. 18 illustrates the silicon wafer or semiconductor chips after further reversal.

As shown in FIG. 18, the thin film member 26 is reversed after the film tape 42 has been adhered in the aforementioned manner, keeping the semiconductor chips 13 held between the thin film member 26 and the film tape 42. The silicon wafer 23 as a set of the semiconductor chips 13 is thus reversed again. The ultraviolet ray is then irradiated on the reversed silicon wafer 23. The resin material sheets 27 are forced to harden at the backside of the silicon wafer 23, namely, at the backsides of the respective semiconductor chips 13. The silane coupling agent in the resin material sheet 27 serves to keep the contact between the resin material sheet 27 and the silicon wafer 23 or chip body 17, in the aforementioned manner. Simultaneously, the silane coupling agent serves to reduce the adhesion between the resin material sheet 27 and the thin film member 26.

Figure 19:
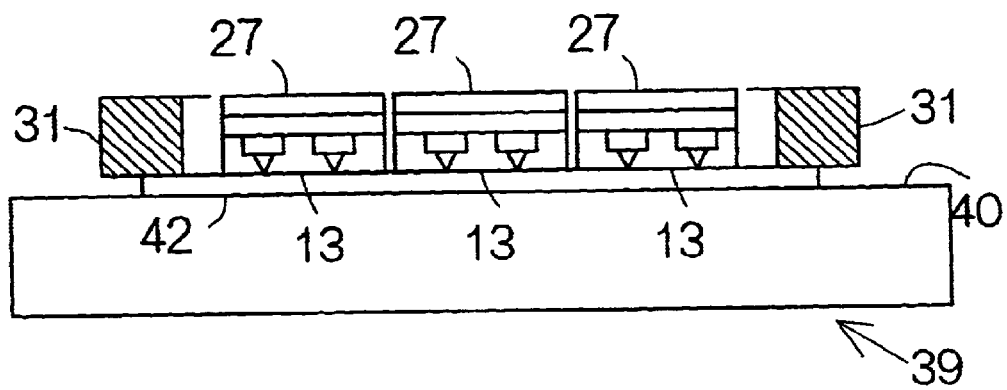
FIG. 19 illustrates the process of peeling off the thin film member from the resin material sheet.

When the adhesion has been reduced between the resin material sheet 27 and the thin film member 26, the thin film member 26 can be peeled off from the semiconductor chips 13, as shown in FIG. 19. Even after the thin film member 26 has been peeled off, the resin material sheet 27 is allowed to remain on the backside of the individual semiconductor chip 13. The individual semiconductor chip 13 can still be kept on the film tape 42.

Figure 20:
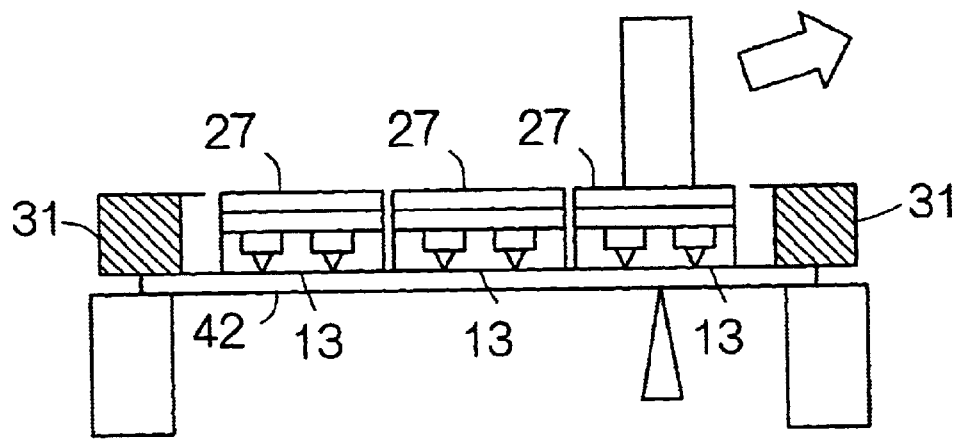
FIG. 20 illustrates the process of picking up the individual semiconductor chip.
Figure 21:
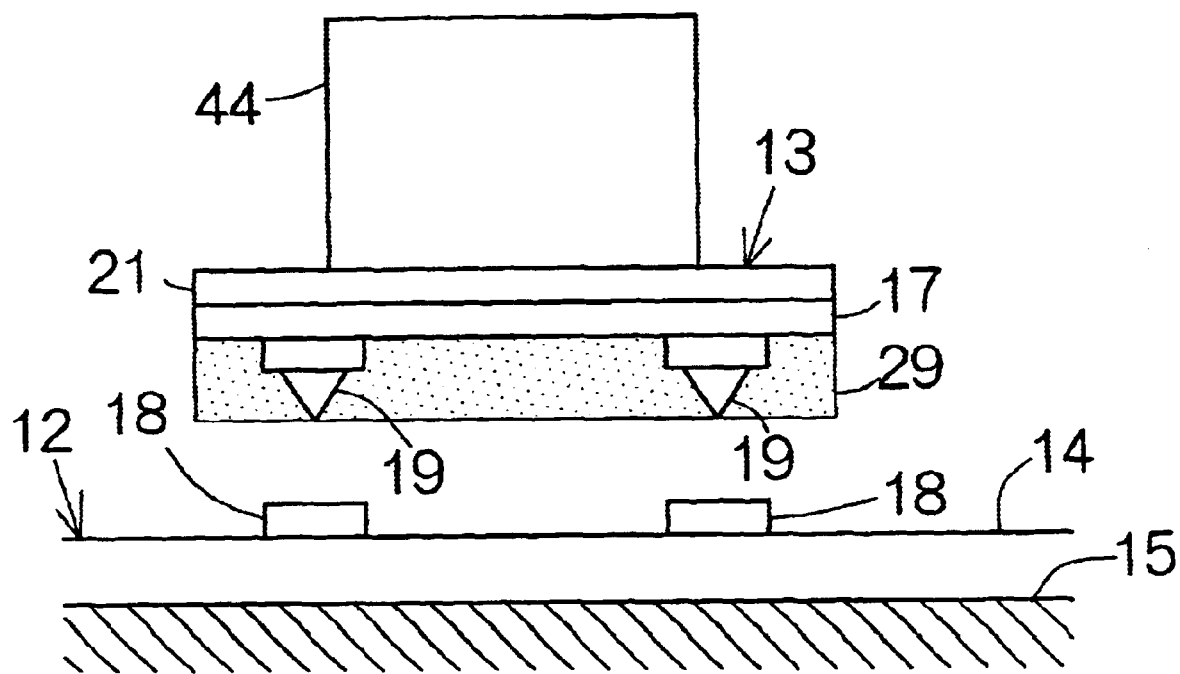
FIG. 21 illustrates the process of bonding the semiconductor chip onto the printed circuit board.

Thereafter, the cut out semiconductor chip 13 is picked up from the film tape 42, as shown in FIG. 20. The picked up semiconductor chip 13 is mounted on the printed circuit board 12. As shown in FIG. 21, a supersonic bonding head 44 is employed to bond the input/output bumps 19 of the semiconductor chip 13 on the input/output pads 18 on the printed circuit board 12. After the semiconductor chip 13 has been bonded on the printed circuit board 12, the printed circuit board 12 is subjected to a heating treatment at the temperature around 150 degrees Celsius. The underfill material sheet 29 thus completely gets cured around the input/output bumps 19. The semiconductor chip 13 has in this manner been mounted on the printed circuit board 12.

The semiconductor chips 13 are reversed in the block before the individual semiconductor chips 13 are mounted on the printed circuit board 12 in the aforementioned method of mounting. In this case, the working time for the method can greatly be reduced as compared with the case where the individual semiconductor chips 13 are separately reversed. In addition, the underfill material is supplied before the individual semiconductor chip 13 has been mounted on the printed circuit board 12, so that the method of supplying the underfill material can be facilitated. In particular, since the supply of the underfill material can be completed before the individual semiconductor chips 13 are cut out from the silicon wafer 23, the working time can greatly be reduced as compared with the case where the underfill material is supplied separately to the individual semiconductor chips 13.

Figure 22:
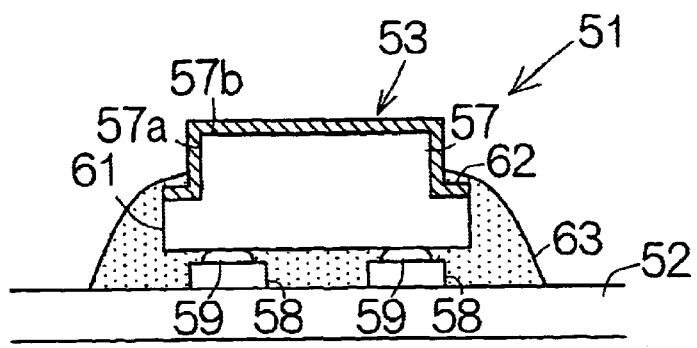
FIG. 22 is a side view schematically illustrating the structure of a printed circuit board unit according to a second embodiment of the present invention.

FIG. 22 schematically illustrates the structure of a printed circuit board unit 51 according to a second embodiment of the present invention. The printed circuit board unit 51 includes a printed circuit board 52 and a semiconductor chip 53 mounted on the printed circuit board 52 in the same manner as the aforementioned first embodiment. The printed circuit board 52 may be constructed in the same manner as the aforementioned printed circuit board 12. A conductive wiring pattern is thus formed to extend over the surface of the printed circuit board 52.

The semiconductor chip 53 includes a chip body 57 and one or more conductive input/output bumps 59 mounted on the lower or downward front side of the chip body 57. A semiconductor circuit is established within the chip body 57. The input/output bumps 59 are received on corresponding conductive input/output pads 58 as a part of the conductive wiring pattern on the printed circuit board 52. The input/output bumps 59 are bonded to the corresponding input/output pads 58. An electric connection is thus established between the chip body 57 and the conductive wiring pattern.

A flange 61 is formed to extend outward from the side or peripheral surface 57*a* of the chip body 57. An evaporated resin lamination 62 is formed to extend over the upward surface of the flange 61. The evaporated resin lamination 62 is designed to continuously extend over not only the upper surface of the flange 61 but also the side 57*a* of the chip body 57 as well as the upward backside 57*b* of the chip body 57.

The input/output bumps 59 are completely embedded within an underfill layer 63 between the chip body 57 and the surface of the printed circuit board 52. The underfill layer 63 also covers over the flange 61 on the chip body 57. The semiconductor chip 53, the assembly of the chip body 57 and the input/output bumps 59, is totally contained within the resin material such as the evaporated resin lamination 62 and the underfill layer 63. The containment of the semiconductor chip 53 in this manner serves to hold tiny fragments, fractured out of the chip body 57, on the chip body 57. A scatter or drop of the tiny fragments can completely be prevented. Moreover, the underfill layer 63 serves not only to prevent deterioration such as corrosion of the input/output bumps 59 but also to reinforce the bonding between the semiconductor chip 53 and the printed circuit board 52.

Figure 23:
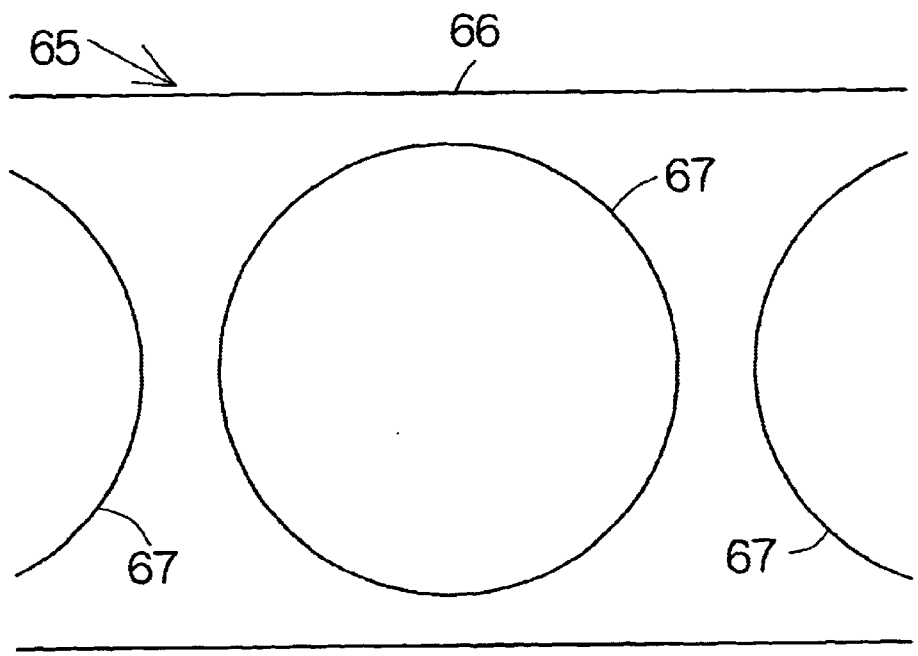
FIG. 23 is a partial plan view of an underfill material supplying tape.
Figure 24:
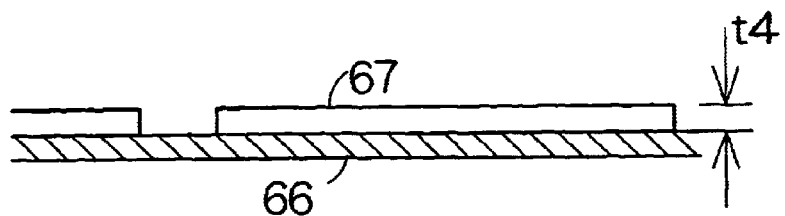
FIG. 24 is a partial sectional view of the underfill material supplying tape.

Next, a description will be made on a method of making the semiconductor chip 53. An underfill material supplying tape 65 is prepared as shown in FIG. 23, for example. The underfill material supplying tape 65 includes circular underfill material sheets or sheets 67 adhered to the surface of a thin film member or tape 66. The underfill material sheet 67 may be shaped to have the diameter slightly smaller than that of the silicon wafer 23 in the aforementioned manner. The underfill material sheets 67 are arranged in line at constant intervals along the longitudinal direction of the thin film member 66. As shown in FIG. 24, the thickness of the underfill material sheet 67 is set at t4[$\mu$m], for example.

In this case, an ultraviolet reactive thermosetting resin may be employed to form the underfill material sheet 67, for example. A silane coupling agent may be mixed in the ultraviolet reactive thermosetting resin in the aforementioned manner. The thin film member 66 may be made from PVC or PET, for example, in the same manner as the aforementioned material supplying tapes 24, 25.

Figure 25:
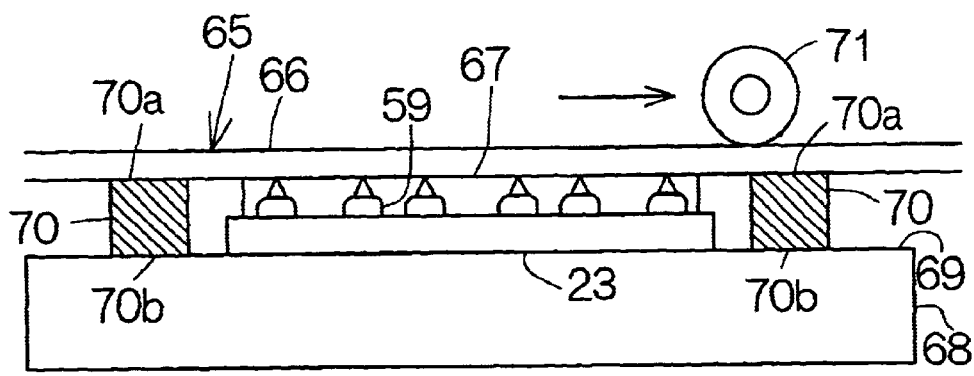
FIG. 25 illustrates the process of urging and adhering the underfill material supplying tape on the backside of the silicon wafer.

As shown in FIG. 25, the silicon wafer 23 is placed on a horizontal plane 69 on a first platen 68. The input/output bumps 59 are kept upward. A stainless steel annular member 70 is also placed on the horizontal plane 69 on the first platen 68, for example. The silicon wafer 23 is received within an inside space of the annular member 70. Specifically, the bore or caliber of the annular member 70 is set slightly larger than the outer periphery of the silicon wafer 23, in the same manner as the aforementioned annular member 31. First and second datum planes 70a, 70b are respectively defined on the annular member 70 in parallel with each other. The annular member 70 is received on the horizontal plane 69 of the first platen 68 at the second datum plane 70b. The distance between the first and second planes 70a, 70b, namely, the thickness of the annular member 70, is set equal to the total thickness of the underfill material sheet 67 and the silicon wafer 23.

The underfill material supplying tape 65 is then superposed on the first datum plane 70a of the annular member 70. For example, the underfill material supplying tape 65 is urged against the horizontal plane 69 of the first platen 68 with the assistance of a pressurizing roller 71. The input/output bumps 59 are forced to bite into the soft underfill material sheet 67. The tip ends of the input/output bumps 59 are allowed to protrude through the underfill material sheet 67 so as to reach the thin film member 66. The adhesion of the underfill material sheet 67 serves to hold the silicon wafer 23 in contact with the thin film member 66.

The thin film member 65 of the underfill material supplying tape 65 is temporarily adhered to the first datum plane 70a of the annular member 70. Such a temporary adhesion may be achieved by adhesion or cohesion previously established on the surface of the thin film member 66, for example. The adhesion or cohesion may be applied to as a specific property of the material for the thin film member 66 itself. Alternatively, the adhesion or cohesion may be achieved by applying an adhesive to the surface of the thin film member 66. The thin film member 66 is then cut out of the underfill material supplying tape 65 along the annular member 70.

Figure 26:
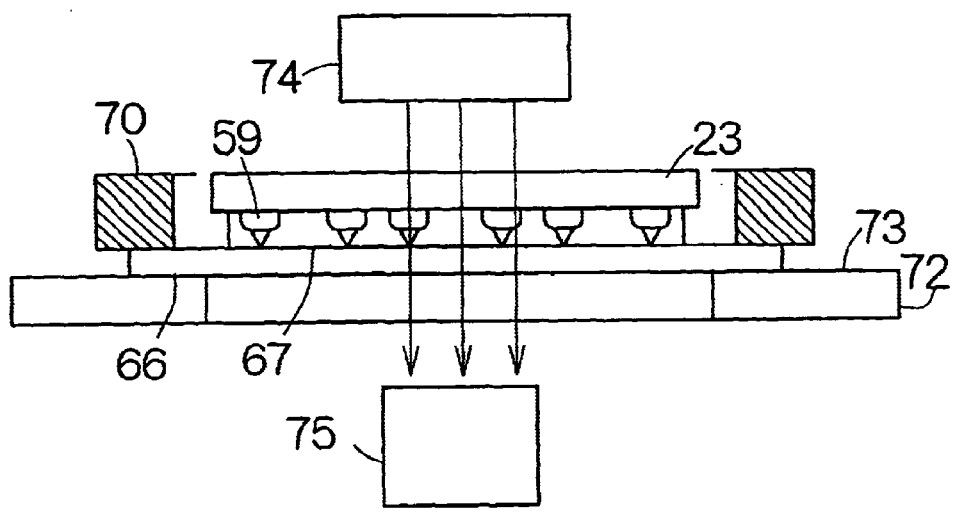
FIG. 26 illustrates the process of determining a cutting line on the silicon wafer before a dicing process.

The silicon wafer 23 is subsequently subjected to a dicing process. The silicon wafer 23 is first reversed along with the annular member 70. The thus reversed silicon wafer 23 is then placed on a horizontal plane 73 on a second platen 72, as shown in FIG. 26. The second platen 72 may be made of a transparent material such as a thick glass plate, for example.

An electromagnetic wave is then irradiated on the silicon wafer 23. An infrared source 74 may be employed to irradiate the electromagnetic wave. An infrared ray irradiated from the infrared source 74 sequentially passes or penetrates through the silicon wafer 23, the underfill material sheet 67 and the thin film member 66. An infrared camera 75 is designed to capture the penetrating infrared ray below the second platen 72. The infrared camera 75 detects the shadow of the input/output bumps 59 which blocks out transmission of the infrared ray. The shadow of the input/output bumps 59 is utilized to determine the cutting position on the silicon wafer 23. In this case, the infrared source 74 and the infrared camera 75 may be moved or shifted along a horizontal direction in unison.

Figure 27:
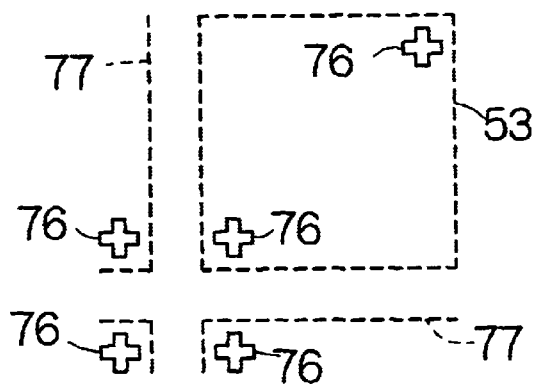
FIG. 27 is an enlarged partial plan view for schematically illustrating the front side of the silicon wafer.

In general, aluminum marks 76 are attached to the silicon wafer 23 at four corners or opposite corners of the expected semiconductor chip 53, as shown in FIG. 27, for example. The marks 76 greatly contribute to imaging the contour of the expected semiconductor chip 53. If the infrared camera 75 can capture the shadow of the marks 76, the cutting line 77 can be determined on the silicon wafer 23 at a higher accuracy.

Figure 28:
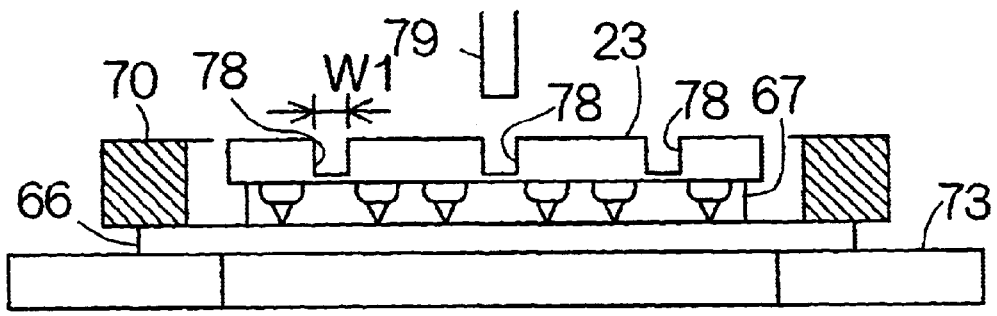
FIG. 28 illustrates the process of forming a nick on the upward backside of the silicon wafer.
Figure 29:
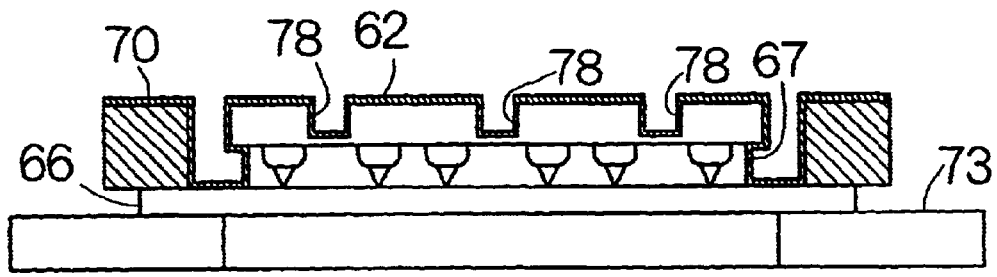
FIG. 29 illustrates the process of forming an evaporated resin lamination on the backside of the silicon wafer.

After the cutting line 77 has been determined in this manner, a nick 78 of a first width W1 is formed on the upward backside of the silicon wafer 23 along the determined contour of the expected semiconductor chips 53, namely, the determined cutting line 77, as shown in FIG. 28. A cutting saw 79 of a first thickness corresponding to the first width W1 may be employed to form the nick 78, for example. When the silicon wafer 23 is thereafter subjected to an evaporation of resin, the evaporated resin lamination 62 of 2–3 $\mu$m thickness can be formed to seamlessly cover all over the upward backside of the silicon wafer 23, as shown in FIG. 29, for example.

Figure 30:
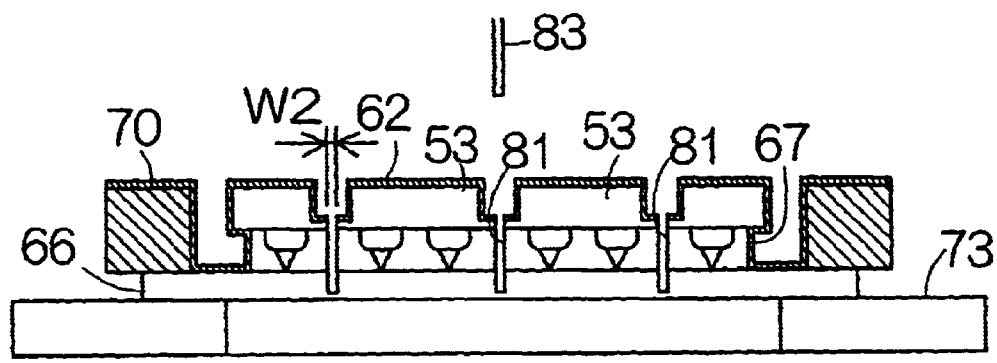
FIG. 30 illustrates the process of cutting the individual semiconductor chips out of the silicon wafer.

The individual semiconductor chips 53 are subsequently cut out along the nick 78, as shown in FIG. 30. An incision 81 of a second width W2 narrower than the first width W1 is forced to trace the nick 78. A cutting saw 83 of a second thickness corresponding to the second width W2 may be employed to establish the incision 81, for example. If the incision 81 is positioned at the centerline of the nick 78, the single incision 81 leads to formation of the flanges 61 on the adjacent semiconductor chips 53 separated by the incision 81.

In addition, the incision 81 of the second width W2 smaller than the first width W1 allows the evaporated resin lamination 62 to reliably remain in the nick 78 except the area subjected to the incision 81. Accordingly, the evaporated resin lamination 62 is allowed to reliably remain on the upward surface of the flange 61 as well as the side 57a of the chip body 57 in the cut out semiconductor chip 53, as shown in FIG. 30.

The incision 81 is restrained from reaching the horizontal plane 73 of the second platen 72. In other words, the incision 81 is not employed to completely separate the thin film member 66. No slit or opening is defined in the thin film member 66 at all as is apparent from FIG. 30. The continuity is totally kept in the thin film member 66. The separated semiconductor chips 53 are kept on the continuous thin film member 66.

Figure 31:
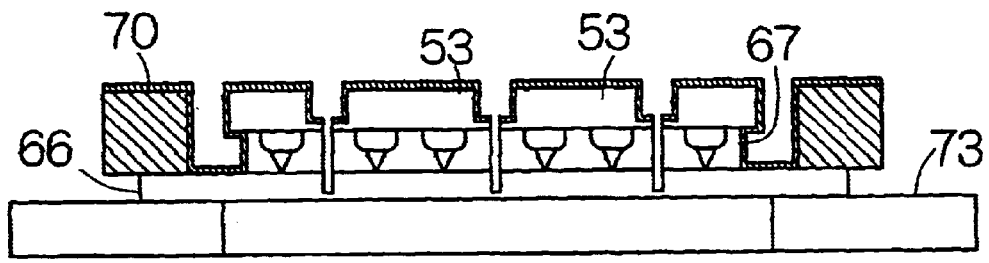
FIG. 31 illustrates the process of irradiating an ultraviolet ray on the silicon wafer.

Thereafter, the ultraviolet ray is irradiated on the silicon wafer 23 or the individual semiconductor chips 53 from an ultraviolet source 82, as shown in FIG. 31. The ultraviolet ray is allowed to penetrate through the thin film member 66 so as to reach the underfill material sheets 67. The underfill material sheets 67 are thus half-cured. The adhesive contact can be kept between the underfill material sheet 67 and the individual semiconductor chip 53, while the adhesion is weakened between the underfill material sheet 67 and the thin film member 66. The semiconductor chip 53 can thus easily be picked up from the thin film member 66.

Figure 32:
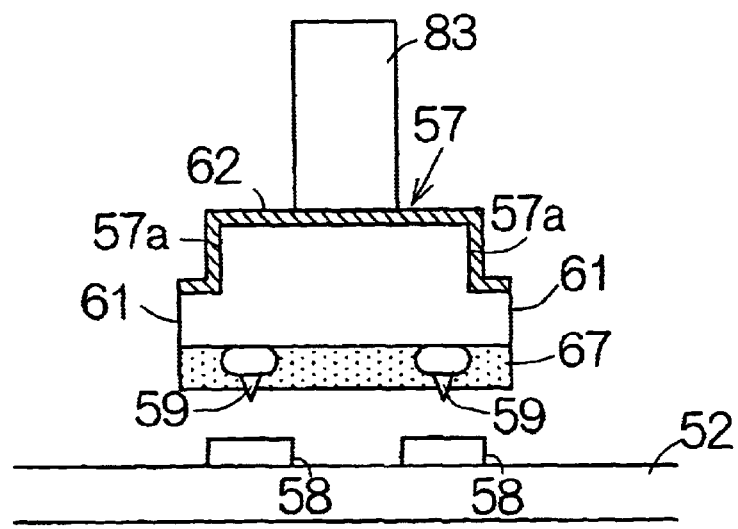
FIG. 32 illustrates the process of mounting the semiconductor chip onto the printed circuit board.

As shown in FIG. 32, the picked semiconductor chip 53 is then mounted on the printed circuit board 52. The input/output bumps 59 are received on the corresponding input/output pads 58 on the printed circuit board 52. A bonding head 83 is employed to urge the semiconductor chip 53 against the printed circuit board 52, for example. The input/output bumps 59 are thus squeezed or compressed. As the input/output bumps 59 get flattened or low-profiled, the underfill material sheet 67 is allowed to overflow out of a space defined between the semiconductor chip 53 and the surface of the printed circuit board 52. The overflowing underfill material sheet 67 flows along the flange 61 so as to finally reach the side 57a of the chip body 57. The chip body 57 is thus completely contained within the evaporated resin lamination 62 and the underfill material sheet 67 in this manner. When the printed circuit board 52 is subjected to a heating treatment, the underfill material sheet 67 gets cured to completely harden. In this manner, the underfill layer 63 can be established as shown in FIG. 22. The semiconductor chip 53 has in this manner been mounted on the printed circuit board 52.

The silicon wafer 23 is only once reversed after formation of the input/output bumps 59 in the aforementioned method of mounting. Accordingly, it is still possible to further facilitate the operation or process, as compared with the aforementioned first embodiment. The working time is greatly shortened.

Figure 33:
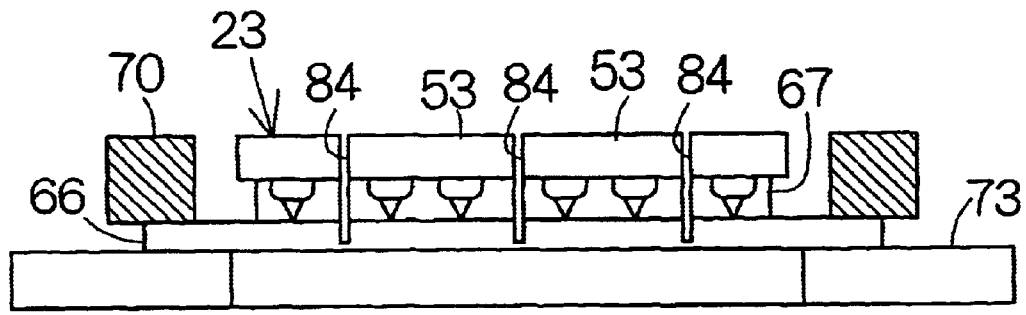
FIG. 33 illustrates the process of cutting the individual semiconductor chips out of the silicon wafer without forming the flange and the evaporated resin lamination.

In this second embodiment, it is not always necessary to form the flange 61 on the chip body 57 in the semiconductor chip 53. Also, it is not always necessary to form the evaporated resin lamination 62 over the exposed surface of the chip body 57. In the case where the flange 61 and the evaporated resin lamination 62 are omitted, an incision 84 of the second width W2 may be employed to cut the silicon wafer 23 without any nick 78, as shown in FIG. 33, for example. Furthermore, the evaporated resin lamination may be formed on the separate semiconductor chips thus cut out on the thin film member 66.

Figure 34:
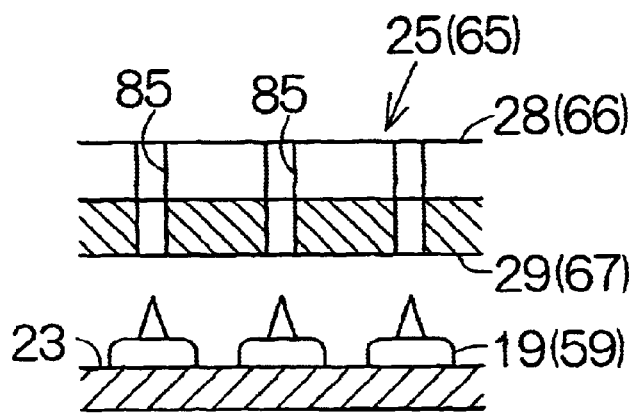
FIG. 34 is an enlarged partial sectional view illustrating the underfill material supplying tape.

As shown in FIG. 34, through holes 85 may be defined in the aforementioned second and underfill material supplying tapes 25, 65, for example. The through holes 85 are designed to continuously penetrate through the underfill material layers 29, 67 and the thin film members 28, 66. The through holes 85 serve to release a gas such as an air existing in the vicinity of the input/output bumps 19, 59 when the second and underfill material tapes 25, 65 are to be superposed on the silicon wafer 23. A gas is prevented from staying between the surface of the silicon wafer 23 and the underfill material sheet 29, 67. The underfill material sheet 29, 67 is allowed to reliably contact the surface of the silicon wafer 23 over its entire surface.

Figure 35:
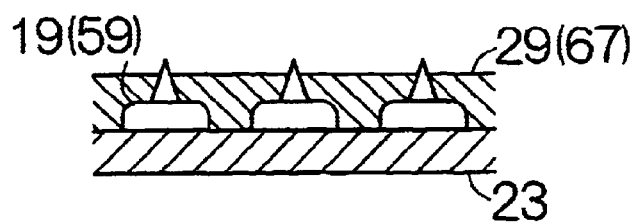
FIG. 35 is an enlarged partial sectional view illustrating the underfill material sheet superposed on the surface of the silicon wafer.

As is apparent from FIG. 34, the location of the through holes 85 in the second and underfill material tape 25, 65 preferably reflects the location or arrangement of the input/output bumps 19, 59 on the silicon wafer 23. If the height of the input/output bumps 19, 59 are set larger than the thickness of the underfill material sheet 29, 67, the input/output bumps 19, 59 are reliably allowed to project the tip ends out of the underfill material sheet 29, 67 through the through holes 85, as shown in FIG. 35. Exposure of the tip ends of the input/output bumps 19, 59 enables a reliable establishment of the connection between the input/output bumps 19, 59 and the input/output pads 18, 58 on the printed circuit board 12, 52 when the semiconductor chip 13, 53 is to be mounted on the printed circuit board 12, 52.

Figure 36:
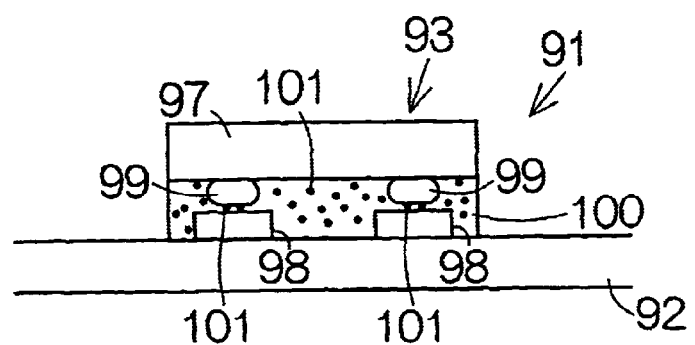
FIG. 36 is a side view schematically illustrating the structure of a printed circuit board unit according to a third embodiment of the present invention.

FIG. 36 schematically illustrates the structure of a printed circuit board unit 91 according to a third embodiment of the present invention. The printed circuit board unit 91 includes a printed circuit board 92 and a semiconductor chip 93 mounted on the printed circuit board 92 in the same manner as the aforementioned first and second embodiments. The printed circuit board 92 may be constructed in the same manner as the aforementioned printed circuit boards 12, 52. A conductive wiring pattern is thus formed to extend over the surface of the printed circuit board 92.

The semiconductor chip 93 includes a chip body 97 and one or more conductive input/output bumps 99 mounted on the downward front side of the chip body 97. A semiconductor circuit is established within the chip body 97. The input/output bumps 99 are received on corresponding conductive input/output pads 98 as a part of the conductive wiring pattern on the printed circuit board 92. The input/output bumps 99 are completely embedded within an underfill layer 100 between the chip body 97 and the surface of the printed circuit board 92, in the same manner as the aforementioned first and second embodiments. Conductive or metallic particles 101, such as silver particles, are dispersed at a predetermined density in the underfill layer 100. The dispersed metallic particles 101 are utilized to establish an electric connection between the input/output bump 99 and the corresponding input/output pad 98.

Figure 37:
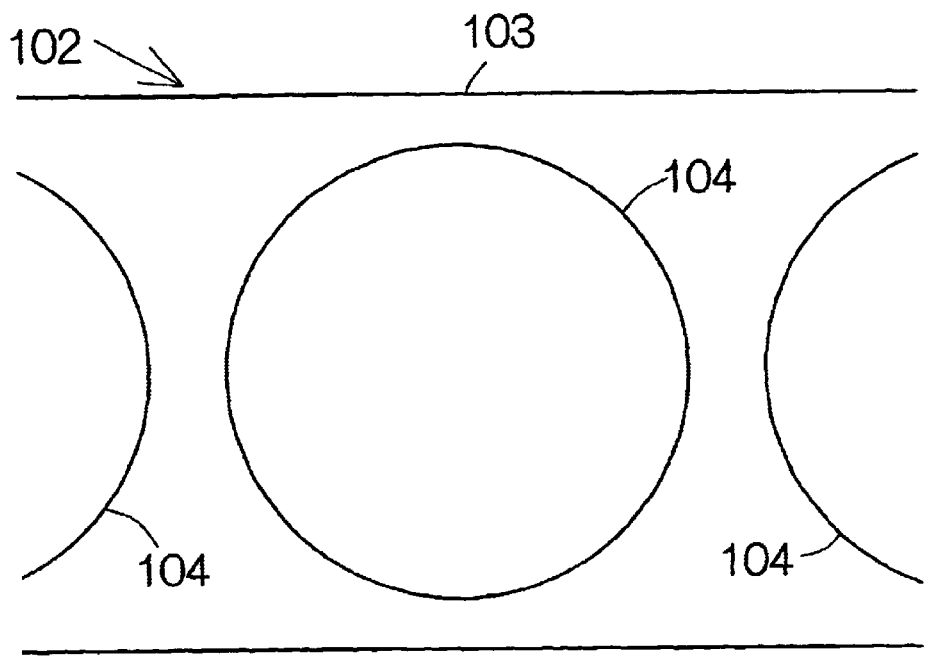
FIG. 37 is a partial plan view of an underfill material supplying tape.

The aforementioned method of making the semiconductor chip 13, 53 may be employed to make the semiconductor chip 93 of this embodiment. In this case, an underfill material supplying tape 102 is prepared as shown in FIG. 37, for example. The underfill material supplying tape 102 includes circular underfill material sheets, namely, circular anisotropic conductive material sheets 104 adhered to the surface of a thin film tape or member 103. The anisotropic conductive material sheet 104 may be shaped to have the diameter slightly smaller than that of the silicon wafer 23 in the aforementioned manner. The anisotropic conductive material sheets 104 are arranged in line at constant intervals along the longitudinal direction of the thin film member 103.

Figure 38:
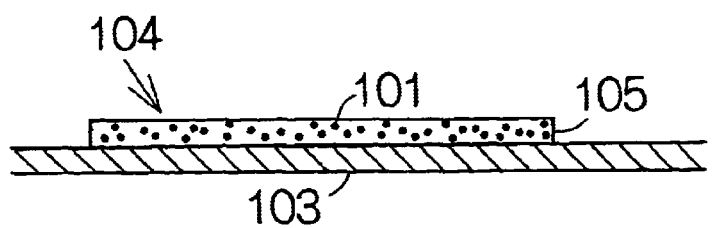
FIG. 38 is a partial sectional view of the underfill material supplying tape.

As shown in FIG. 38, the anisotropic conductive material sheet 104 includes an insulating material layer 105, such as a layer of an ultraviolet reactive thermosetting resin, received on the surface of the thin film member 103. The conductive or metallic particles 101 are uniformly dispersed at the predetermined density in the insulating material layer 105. A silane coupling agent may be mixed in the ultraviolet reactive thermosetting resin in the aforementioned manner. The thin film member 103 maybe made from PVC or PET, for example, in the same manner as the aforementioned material supplying tapes 24, 25, 65.

Figure 39:
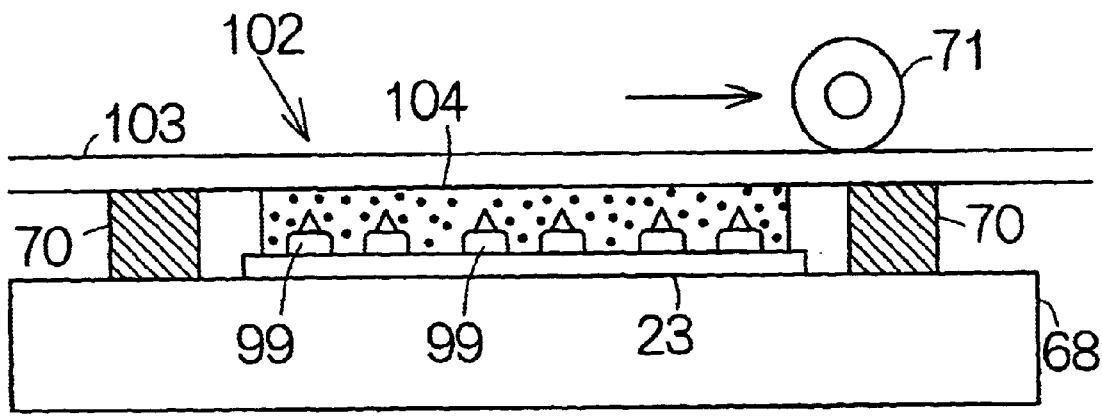
FIG. 39 illustrates the process of urging and adhering the underfill material supplying tape on the backside of the silicon wafer.

As shown in FIG. 39, the anisotropic conductive material sheet 104 is superposed on the silicon wafer 23 on the aforementioned first platen 68, for example. In this case, the thickness of the anisotropic conductive material sheet 104 is set larger than the height of the input/output bumps 99 arranged on the upward front side of the silicon wafer 23. Thereafter, the silicon wafer 23 is subjected to a dicing process in the aforementioned manner. The individual semiconductor chips 93 are respectively cut out of the silicon wafer 23.

Figure 40:
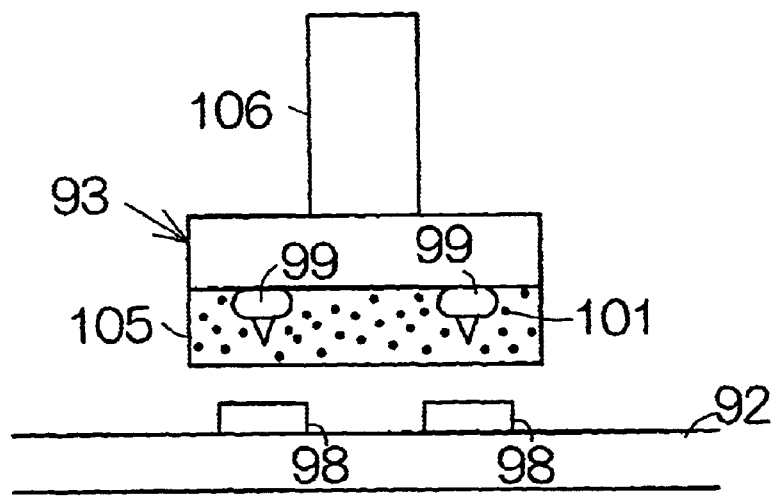
FIG. 40 illustrates the process of mounting the semiconductor chip onto the printed circuit board.

The cut out semiconductor chip 93 is mounted on the printed circuit board 92 as shown in FIG. 40, for example. When the semiconductor chip 93 is urged against the printed circuit board 92, the metallic particles 101 dispersed in the insulating material layer 105 are interposed between the input/output bump 99 and the corresponding input/output pad 98. A bonding head 106 may be employed to urge the semiconductor chip 93, for example. Thereafter, when the insulating material layer 105 is forced to get hardened, the semiconductor chip 93 can be fixed on the printed circuit board 92.

Employment of the anisotropic conductive material sheet 104 enables a reliable establishment of the electric connection between the input/output bumps 99 and the corresponding input/output pads 98, respectively, even when all of the input/output bumps 99 fail to have a constant height. In particular, an electric connection can reliably be established between the input/output bumps 99 and the corresponding input/output pads 98, respectively, even in the case where a large number of input/output bumps 99 are formed on the single semiconductor chip 93.

Figure 41:
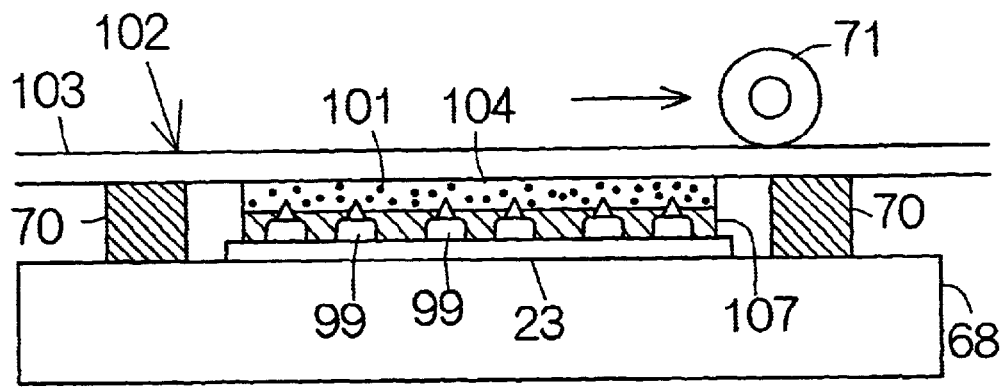
FIG. 41 illustrates the process of urging and adhering the underfill material supplying tape comprising an anisotropic conductive material layer and an utter insulating material layer on the backside of the silicon wafer.

As shown in FIG. 41, the underfill material supplying tape 101 may further include an utter insulating material layer 107, without any metallic or conductive particles, over the surface of the anisotropic conductive material sheet 104 on the thin film member 103, for example. The utter insulating material layer 107 may be made of the same material as of the insulating material layer 105 of the anisotropic conductive material sheet 104. The utter insulating material layer 107 serves to apparently increase the thickness of the underfill material sheet including the anisotropic conductive material sheet 104 on the thin film member 103. The usage of the expensive anisotropic conductive material sheet 104 can be reduced as compared with the case where the anisotropic conductive sheet 104 is solely included in the underfill material sheet. Superposition of the utter insulating material layer 107 contributes to reduction in the production cost.

Figure 42:
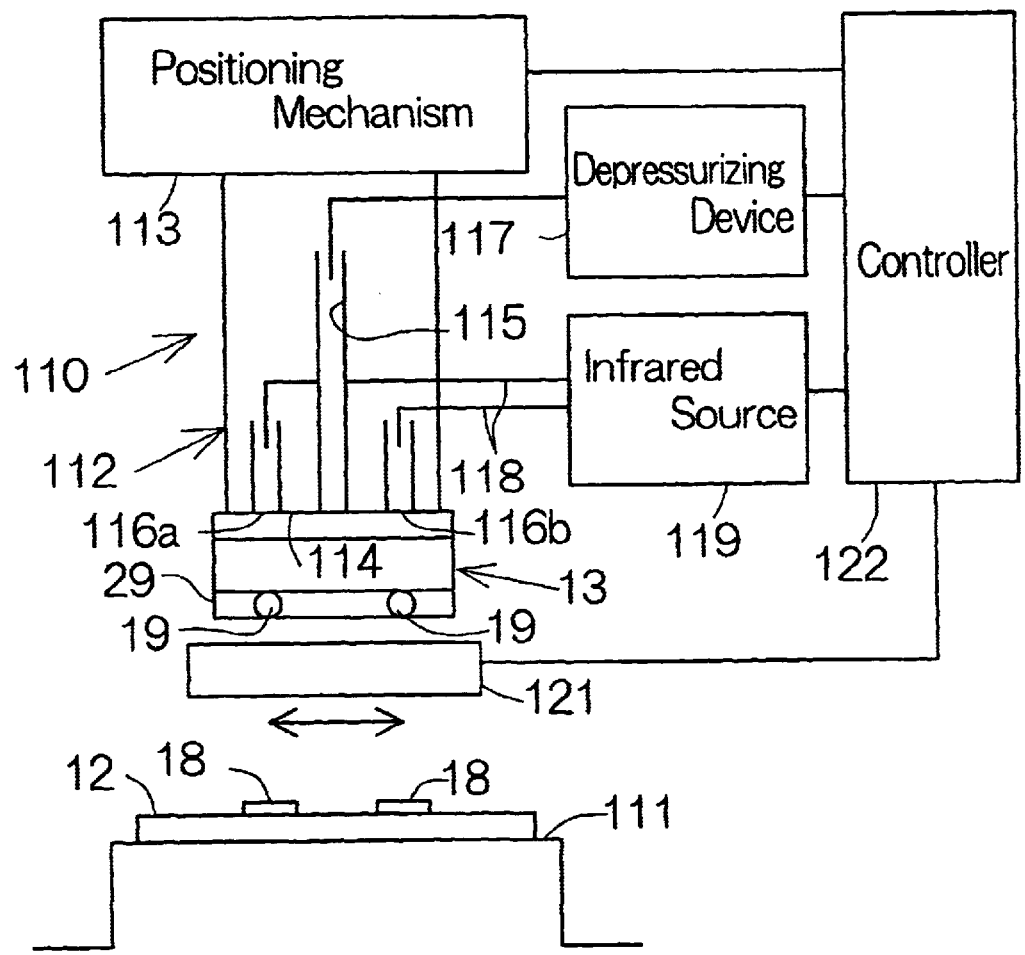
FIG. 42 schematically illustrates the structure of a semiconductor chip mounter according to an example of the present invention.

FIG. 42 schematically illustrates the structure of a semiconductor chip mounter 110 according to an example of the present invention. The semiconductor chip mounter 110 includes a table or platen 111 for receiving the printed circuit board 12 at a horizontal plane, and a bonding head 112 opposed to the horizontal plane of the platen 111. The bonding head 112 is allowed to move within a three-dimensional coordinate system established on the platen 111. The three-dimensional coordinate system may include the xy-plane or rectangular coordinates defined on the horizontal plane of the platen 111, and the z-axis perpendicular to the horizontal plane of the platen 111. A positioning mechanism 113, for example, may be employed to achieve the movement of the bonding head 112 based on the three-dimensional coordinate system. The positioning mechanism 113 may include a combination of guiding mechanisms for guiding the bonding head 112 along the x-, y- and z-axes, respectively, for example.

A downward chip receiving surface 114 is defined on the tip or lowest end of the bonding head 112. The chip receiving surface 114 is kept in the attitude in parallel with the horizontal plane of the platen 111. A depressurizing passage 115 is defined in the bonding head 112 so as to open at the chip receiving surface 114. A pair of electromagnetic wave output openings 116a, 116b are likewise defined in the bonding head 112 so as to open at the chip receiving surface 114, respectively. A depressurizing device 117 is connected to the depressurizing passage 115. The depressurizing device 117 is for example designed to suck the air out of the depressurizing passage 115.

An optical fiber 118 is designed to expose the tip or leading end at the electromagnetic wave output opening 116a, 116b. The root end of the optical fiber 118 is connected to an infrared source 119. The optical fibers 118 thus serve to guide an infrared ray from the infrared source 119 to the electromagnetic wave output openings 116a, 116b, respectively. The infrared ray is irradiated from the electromagnetic wave output openings 116a, 116b toward the platen 111.

An electromagnetic wave detector such as an infrared camera 121 is incorporated in the semiconductor chip mounter 110 of this example. The infrared camera 121 is allowed to move in the horizontal direction along a horizontal plane, for example. The infrared camera 121 can be positioned at a predetermined detecting position where the infrared camera 121 is allowed to face the chip receiving surface 114 in a space between the bonding head 112 and the platen 111. The infrared camera 121 at the detecting position is allowed to capture the image of the chip receiving surface 114. The horizontal movement of the infrared camera 121 enables the retreat of the infrared camera 121 out of the space between the chip receiving surface 114 and the platen 111. A controller 122 is designed to control the action of the positioning mechanism 113, the depressurizing device 117, the infrared source 119 and the infrared camera 121, for example.

Here, a brief description will be made on the operation of the semiconductor chip mounter 110. Now, assume that the semiconductor chip 13 is absorbed on the bonding head 112 at the chip receiving surface 114. The underfill material sheet 29 is attached to the front surface receiving the input/output bumps 19 in the semiconductor chip 13 in the aforementioned manner. The input/output bumps 19 are completely embedded within the underfill material sheet 29. The semiconductor chip 13 is allowed to receive the chip receiving surface 114 of the bonding head 112 at the upward backside. The depressurizing device 117 is operated to suck the air within the depressurizing passage 115 so as to achieve the absorption of the semiconductor chip 13 onto the bonding head 112.

The controller 122 instructs to position the bonding head 112 at a specific position. The position of the bonding head 112 can accurately be fixed in the three-dimensional coordinate system. The controller 122 also instructs to position the infrared camera 121 below the bonding head 112 at a position opposed to the chip receiving surface 114 or the downward front side of the semiconductor chip 13. The controller 122 subsequently supplies an instructions signal to the infrared source 119 for irradiating the infrared ray.

Figure 43:
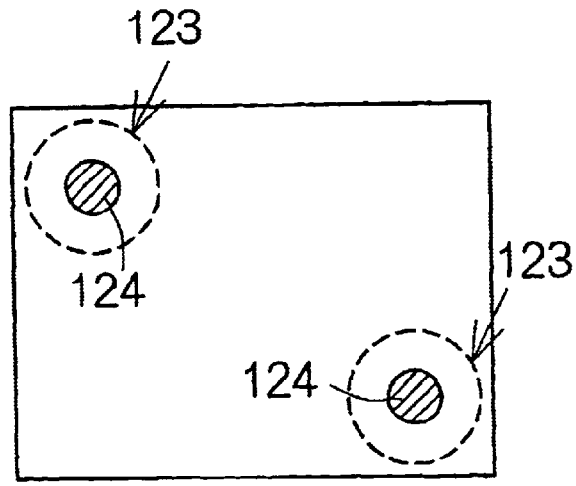
FIG. 43 is a plan view schematically illustrating the image of the semiconductor chip captured by an infrared camera.

The infrared ray is allowed to penetrate through the chip body 17 made of silicon as well as the resin lamination 21 and underfill material sheet 29 made of resin in the semiconductor chip 13. On the other hand, the metallic input/output bumps 19 serve to block or diffuse the infrared ray. The infrared ray passing and not passing through the semiconductor chip 13 serves to generate the contrast of irradiation detected at the infrared camera 121, as shown in FIG. 43, for example. In other words, the shadow 124 of the input/output bumps 19 can be detected at the infrared camera 121 based on the irradiation of the infrared ray.

The controller 122 determines the positional relationship between the input/output bumps 19 and the bonding head 112 based on the detected shadow 124. The position of the input/output bumps 19 can be determined at a higher accuracy based on a predetermined absolute position of the bonding head 112 in the three-dimensional coordinate system and the determined positional relationship between the input/output bumps 19 and the bonding head 112. The controller 122 controls the positioning mechanism 113 based on the thus determined position of the input/output bumps 19 in the three-dimensional coordinate system. The bonding head 112 along with the semiconductor chip 13 can thus be positioned relative to the printed circuit board 12 at a higher accuracy. The input/output bumps 19 on the semiconductor chip 13 can reliably be received on the corresponding input/output pads 19 over the printed circuit board 12.

Figure 44:
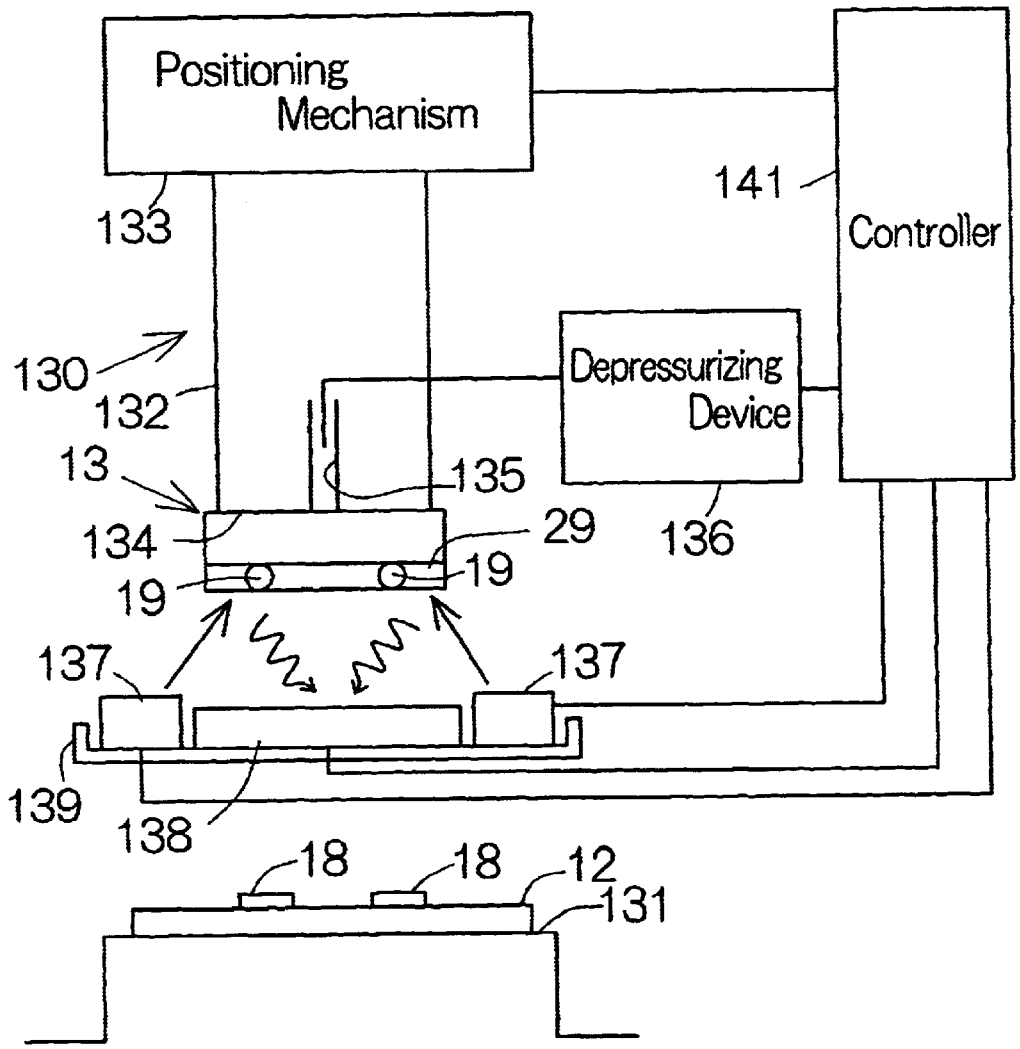
FIG. 44 schematically illustrates the structure of a semiconductor chip mounter according to another example of the present invention.

FIG. 44 schematically illustrates the structure of a semiconductor chip mounter 130 according to another example of the present invention. The semiconductor chip mounter 130 includes a table or platen 131 for receiving the printed circuit board 12 at a horizontal plane, and a bonding head 132 opposed to the horizontal plane of the platen 131, in the same manner as the aforementioned semiconductor chip mounter 110. The bonding head 132 is allowed to move within a three-dimensional coordinate system established on the platen 131. A positioning mechanism 133, for example, may be employed to achieve the movement of the bonding head 132 based on the three-dimensional coordinate system. The positioning mechanism 133 may be constructed in the same manner as the aforementioned positioning mechanism 113.

A downward chip receiving surface 134 is defined on the tip or lowest end of the bonding head 132. The chip receiving surface 134 is kept in the attitude in parallel with the horizontal plane of the platen 131. A depressurizing passage 135 is defined in the bonding head 132 so as to open at the chip receiving surface 134. A depressurizing device 136 is connected to the depressurizing passage 135. The depressurizing device 136 is for example designed to suck the air out of the depressurizing passage 135.

The semiconductor chip mounter 130 further includes an irradiation source 137 for an electromagnetic wave and a fluorescent light detector such as an imaging camera 138. The imaging camera 138 may include a CCD (charge-coupled device), for example. As shown in FIG. 44, the irradiation source 137 and imaging camera 138 may be carried on a common support frame 139. The support frame 139 may be allowed to move along the horizontal direction, for example. The support frame 39 can be positioned at a predetermined detecting position where the irradiation source 137 and the imaging camera 138 are allowed to face the chip receiving surface 134 in a space between the bonding head 132 and the platen 131. The irradiation source 137 at the detecting position is allowed to irradiate an electromagnetic wave toward the chip receiving surface 134. Simultaneously, the imaging camera 138 is allowed to capture the image of the chip receiving surface 134. The horizontal movement of the support frame 139 enables the retreat of the irradiation source 137 and the imaging camera 138 out of the space between the chip receiving surface 134 and the platen 131. A controller 141 is designed to control the action of the positioning mechanism 133, the depressurizing device 136, the irradiation source 137 and the imaging camera 138, for example.

When the semiconductor chip 13 is absorbed on the bonding head 132 at the chip receiving surface 134 in the semiconductor chip mounter 130, the controller 141 instructs to position the bonding head 132 at a specific position. The position of the bonding head 132 is accurately be fixed in the three-dimensional coordinate system. The controller 141 also instructs to position the irradiation source 137 and the imaging camera 138 below the bonding head 132 at a position opposed to the chip receiving surface 134 or the downward front side of the semiconductor chip 13. The controller 141 subsequently supplies an instructions signal to the irradiation source 137 for irradiating a specific electromagnetic wave.

Figure 45:
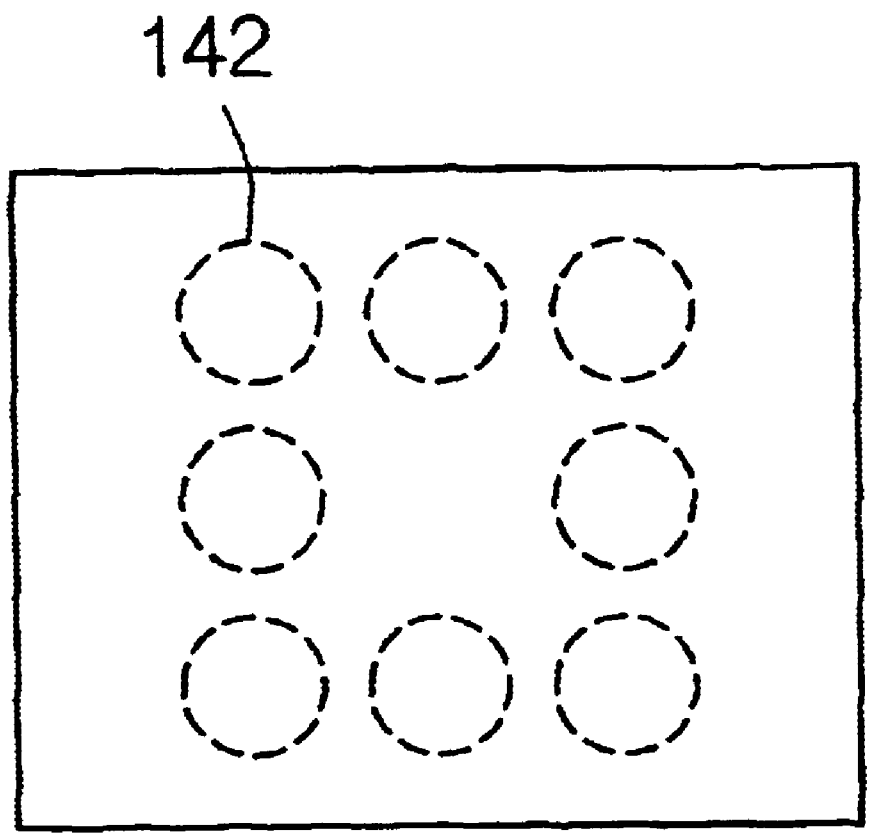
FIG. 45 is a plan view schematically illustrating the image of the semiconductor chip captured by an imaging camera.

The underfill material sheet 29 in the semiconductor chip 13 generates a fluorescent light in response to the irradiation of the electromagnetic wave, such as a light. The fluorescent light induces the contrast depending upon the thickness of the underfill material sheet 29. Specifically, only the fluorescent light of a smaller intensity can be induced in the underfill material sheet 29 at a region covering over the input/output bumps 19 as compared with a region directly contacting the chip body 17. The imaging camera 138 serves to photograph the intensity of the fluorescent light dependent on the thickness of the underfill material sheet 29, as shown in FIG. 45, for example. The shadow 142 of the input/output bumps 19 can be captured. The controller 141 is thus allowed to determine the positional relationship between the input/output bumps 19 and the bonding head 132 based on the shadow 142, in the aforementioned manner.

It should be noted that an x-ray and other type of the electromagnetic wave can be employed, in place of the aforementioned infrared ray in determining the position of the input/output bumps 19, 59 as well as the mark 76, for example.

What is claimed is:

1. A method of supplying an underfill material for a semiconductor chip, comprising:

locating a wafer which receives a conductive bump on an upward front side of the wafer, said conductive-bump to be received on a printed circuit board; and transferring an underfill material sheet, adhered to a surface of a thin film member, onto the upward front side of the wafer, said underfill material sheet being made of an insulating non-conductive material.

2. A method of supplying an underfill material for a semiconductor chip, comprising:

locating a wafer which receives a conductive bump on an upward front side of the wafer;

transferring an underfill material sheet, adhered to a surface of a thin film member, onto the upward front side of the wafer by urging the underfill material sheet onto the upward front side of the wafer after softening the underfill material sheet; and peeling the thin film member from the underfill material sheet after hardening the underfill material sheet.

3. A method of making a semiconductor chip, comprising:

forming a conductive bump on an upward front side of a wafer;

reversing the wafer; and transferring a resin sheet, adhered to a surface of a thin film member, to a backside of the wafer, so as to form a resin lamination on the backside of the wafer.

4. A method of making a semiconductor chip, comprising:

reversing a wafer receiving a conductive bump on an upward front side;

irradiating an X-ray on the wafer;

determining a cutting position on the wafer based on the X-ray penetrating through the wafer; and dicing the wafer from a backside of the wafer based on the cutting position.

5. The method of making according to claim 4, further comprising:

forming a nick along a contour of the semiconductor chip on the backside of the wafer; and forming an evaporated resin lamination on the backside of the wafer.

6. The method of making according to claim 5, further comprising cutting out an individual semiconductor chip along the pick with an incision narrower than the nick after formation of the evaporated resin lamination.

7. A method of making a semiconductor chip, comprising:

locating a wafer receiving a conductive bump on an upward front side;

adhering an underfill material sheet onto the upward front side of the wafer;

reversing the wafer; and dicing the wafer from a backside of the wafer.

8. The method of making according to claim 7, further comprising:

irradiating an electromagnetic wave on the wafer; and determining a cutting position on the wafer based on the electromagnetic wave penetrating through the wafer.

9. The method of making according to claim 7, further comprising:

forming a nick along a contour of the semiconductor chip on the backside of the wafer; and forming an evaporated resin lamination on the backside of the wafer.

10. The method of making according to claim 9, further comprising cutting out an individual semiconductor chip along the nick with an incision narrower than the nick after formation of the evaporated resin lamination.

11. The method according to claim 4, wherein a shadow of the conductive bump is utilized to determine the cutting position.

12. The method according to claim 8, wherein a shadow of a metal mark on the wafer is utilized to determine the cutting position.

13. The method of supplying according to claim 1, wherein said underfill material sheet is made of a mixture of a thermosetting adhesive end a thermoplastic resin.

14. The method of supplying according to claim 1, wherein a height of said conductive bump is set equal to or larger than a thickness of the underfill material sheet.

15. The method of supplying according to claim 2, wherein said conductive bump is to be received on a printed circuit board.

16. The method of supplying according to claim 2, wherein said underfill material sheet is made of a mixture of a thermosetting adhesive and a thermoplastic resin.

17. The method of supplying according to claim 2, wherein a height of said conductive bump is set equal to or lager than a thickness of the underfill material sheet.

* * * * *

UNITED STATES PATENT AND TRADEMARK OFFICE
CERTIFICATE OF CORRECTION

PATENT NO. : 6,716,665 B2
DATED : April 6, 2004
INVENTOR(S) : Shunji Baba et al.

It is certified that error appears in the above-identified patent and that said Letters Patent is hereby corrected as shown below:

Column 20,
Line 61, change "pick" to -- nick --.

Signed and Sealed this

Twenty-third Day of November, 2004

JON W. DUDAS
*Director of the United States Patent and Trademark Office*